United States Patent
Imazeki et al.

(10) Patent No.: US 10,412,832 B2
(45) Date of Patent: Sep. 10, 2019

(54) DISPLAY DEVICE

(71) Applicant: Japan Display Inc., Tokyo (JP)

(72) Inventors: Yoshikatsu Imazeki, Tokyo (JP); Yoichi Kamijo, Tokyo (JP); Shuichi Osawa, Tokyo (JP); Yoshihiro Watanabe, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 15/876,835

(22) Filed: Jan. 22, 2018

(65) Prior Publication Data

US 2018/0212550 A1  Jul. 26, 2018

(30) Foreign Application Priority Data

Jan. 23, 2017 (JP) ................... 2017-009475

(51) Int. Cl.
| | | |
|---|---|---|
| *H05K 1/11* | (2006.01) | |
| *G06F 3/041* | (2006.01) | |
| *G06F 3/044* | (2006.01) | |
| *H05K 1/18* | (2006.01) | |

(52) U.S. Cl.
CPC ............ *H05K 1/115* (2013.01); *G06F 3/044* (2013.01); *G06F 3/0412* (2013.01); *G06F 3/0416* (2013.01); *H05K 1/116* (2013.01); *H05K 1/189* (2013.01); *H05K 2201/10136* (2013.01)

(58) Field of Classification Search
CPC ...... G06F 3/044; G06F 3/0416; G06F 3/0412; H05K 1/189; H05K 1/115; H05K 1/116; H05K 2201/10136
See application file for complete search history.

(56) References Cited

U.S. PATENT DOCUMENTS

| | | | |
|---|---|---|---|
| 7,767,913 B2* | 8/2010 | Corisis | H01L 23/66 |
| | | | 174/260 |
| 9,960,079 B2* | 5/2018 | Myers | H01L 21/486 |
| 2010/0309152 A1 | 12/2010 | Kusuda et al. | |
| 2018/0314120 A1* | 11/2018 | Peng | H01L 27/0288 |

FOREIGN PATENT DOCUMENTS

| | | |
|---|---|---|
| JP | 2009-237410 A | 10/2009 |
| WO | 2009/057628 A1 | 5/2009 |

* cited by examiner

*Primary Examiner* — Liliana Cerullo
(74) *Attorney, Agent, or Firm* — K&L Gates LLP

(57) ABSTRACT

According to one embodiment, the display device includes a first substrate, a second substrate and a connecting material. The first substrate includes a first basement and a first conductive layer. The second substrate includes a second basement including a first surface, a second surface and a first hole located in the non-display area, and a second conductive layer provided on the second surface. The connecting material electrically connects the first conductive layer and the second conductive layer to each other via the first hole. The connecting material covers at least partially a portion of an opening edge belonging to the second region but does not cover a portion belonging to the first region.

17 Claims, 19 Drawing Sheets

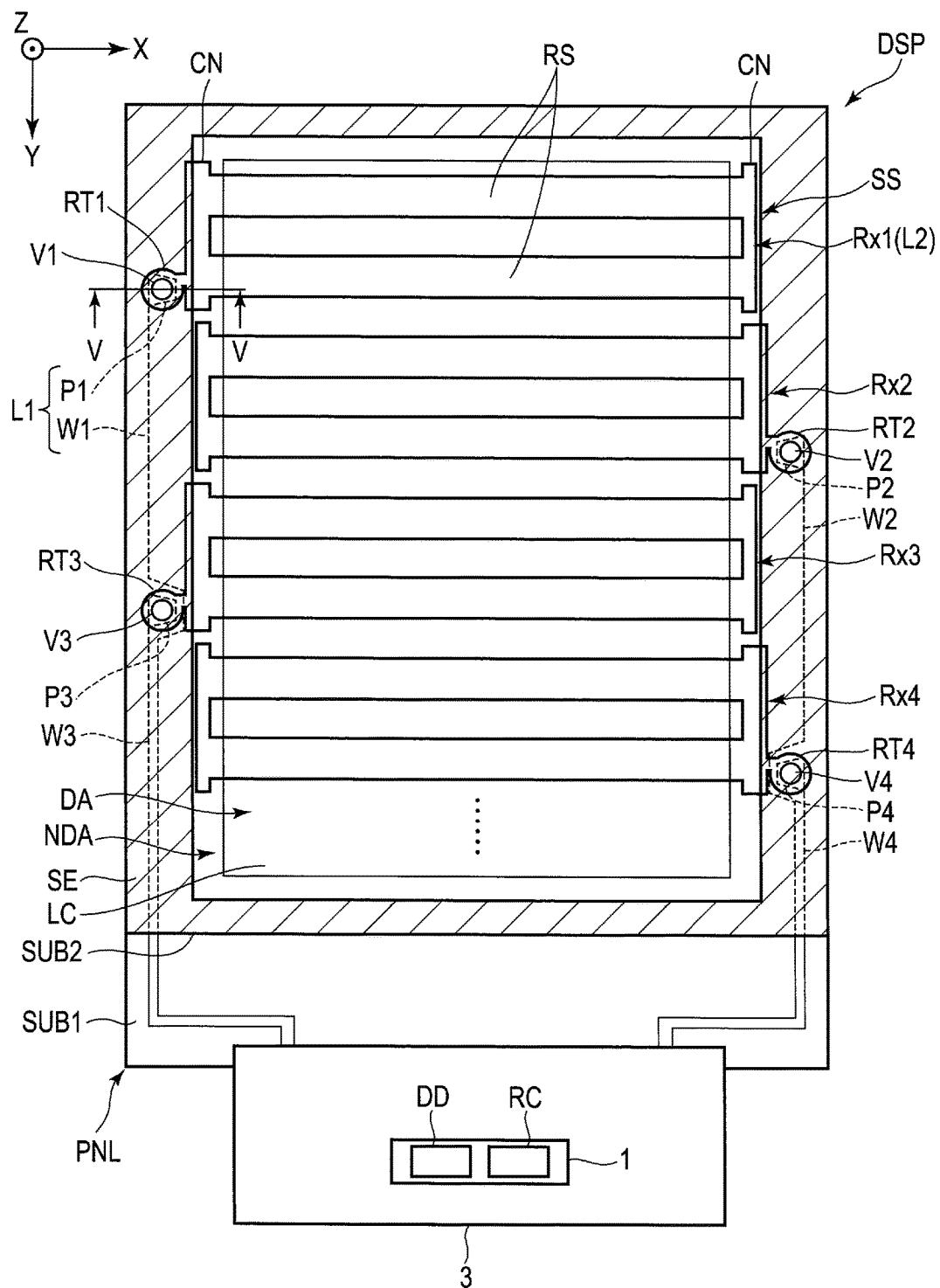
F I G. 1

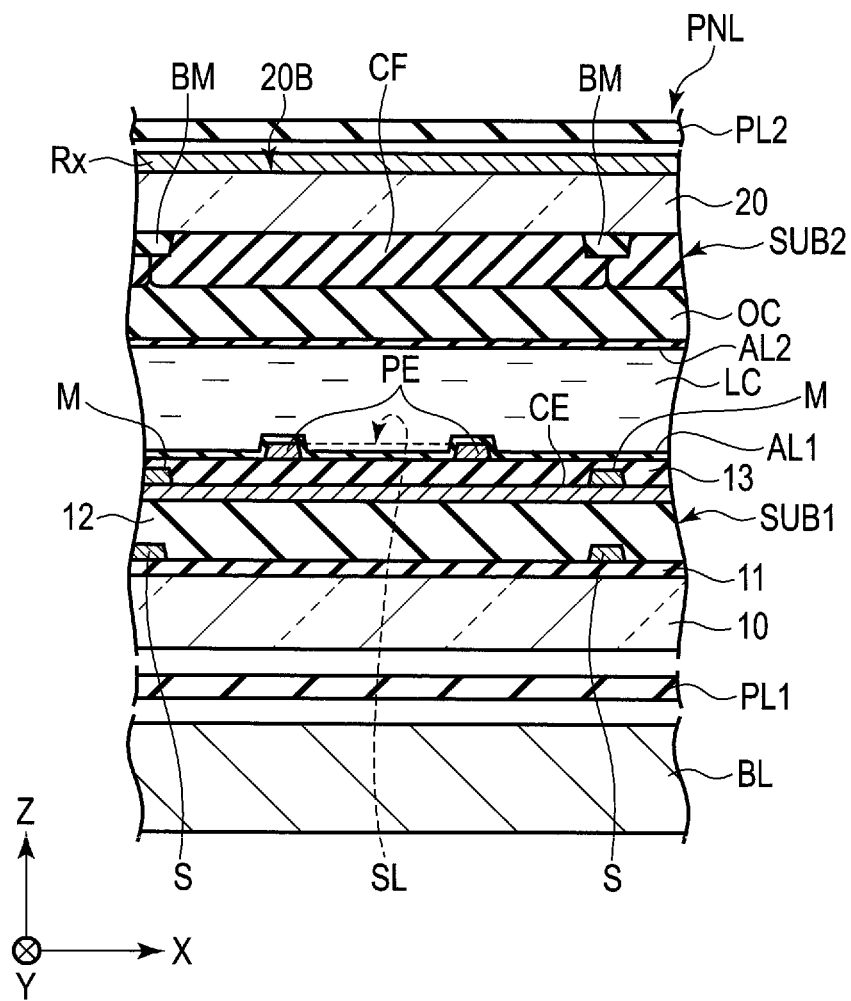
F I G. 3

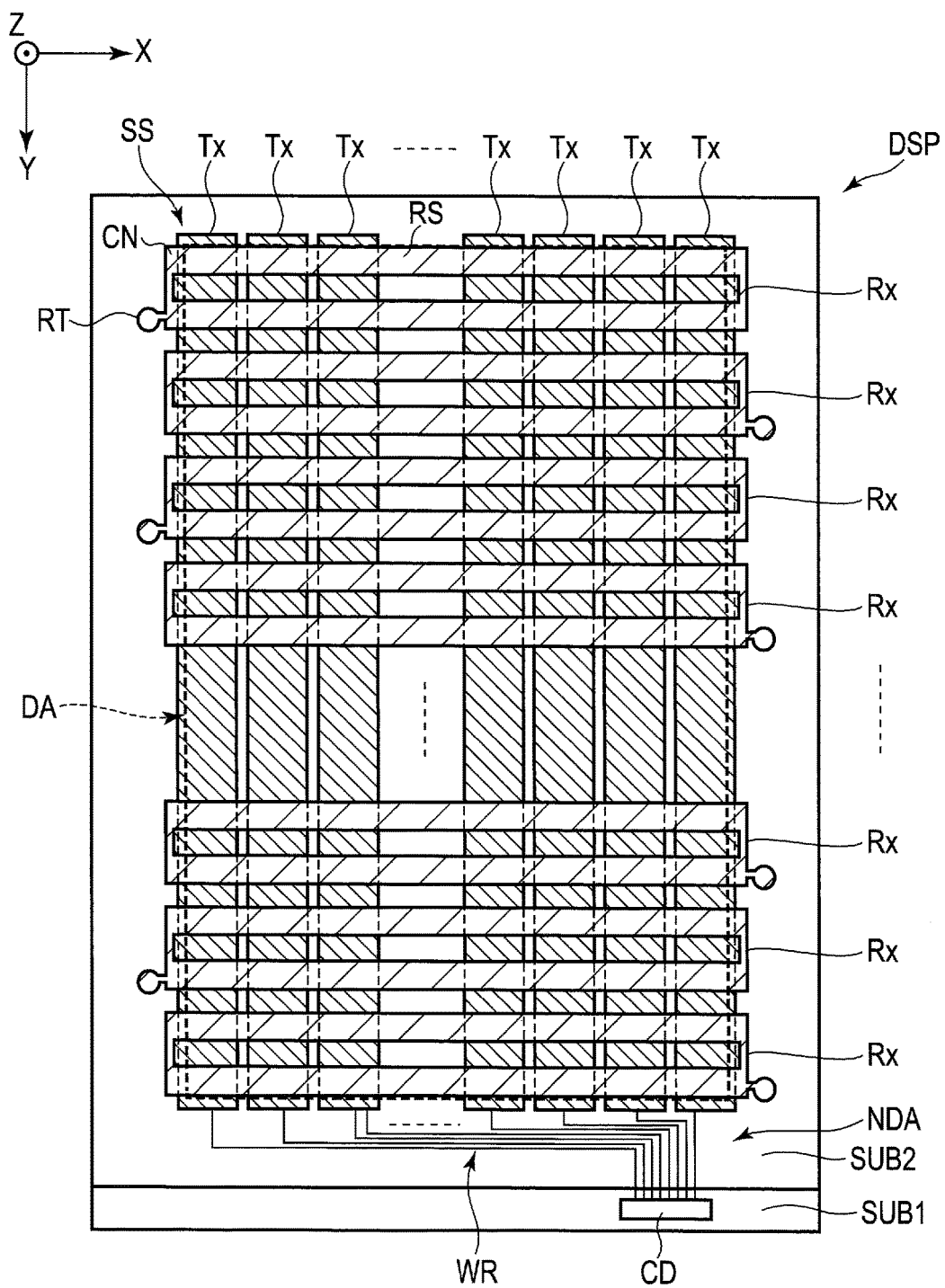
F I G. 4

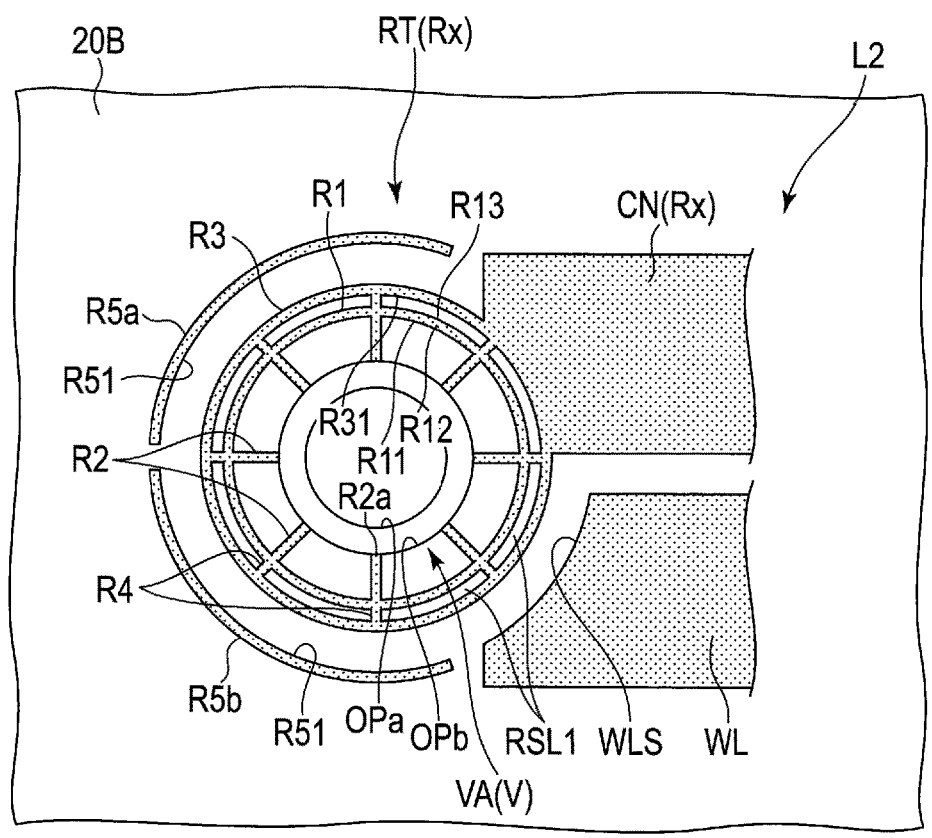
F I G. 6

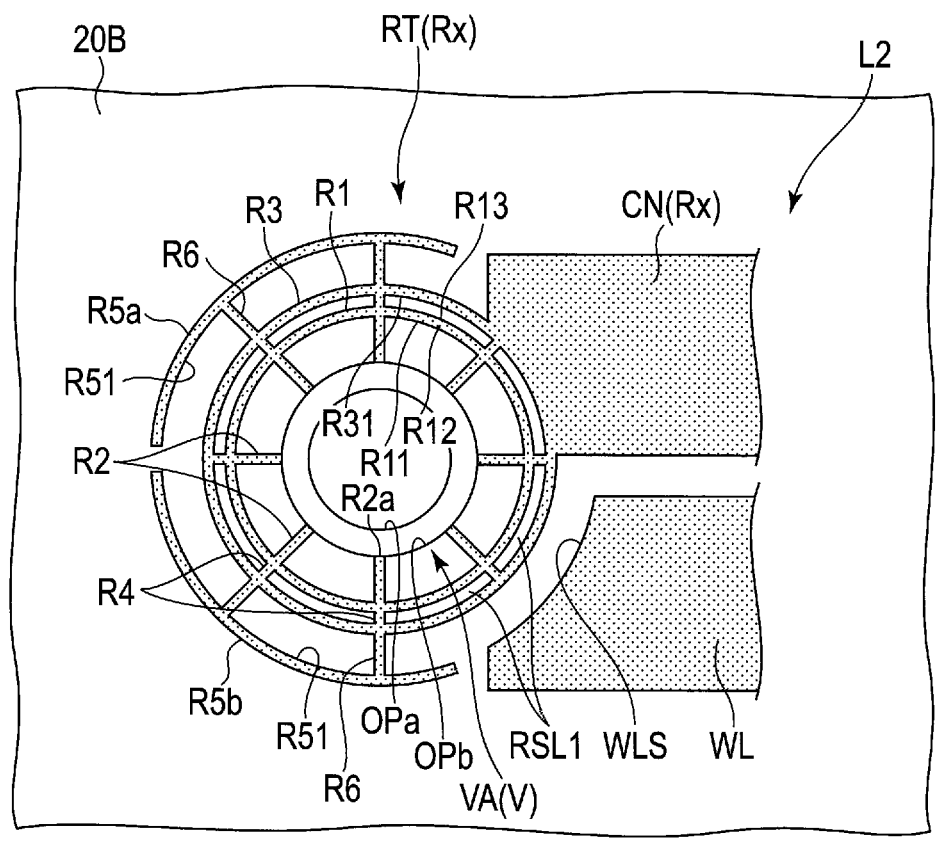
F I G. 7

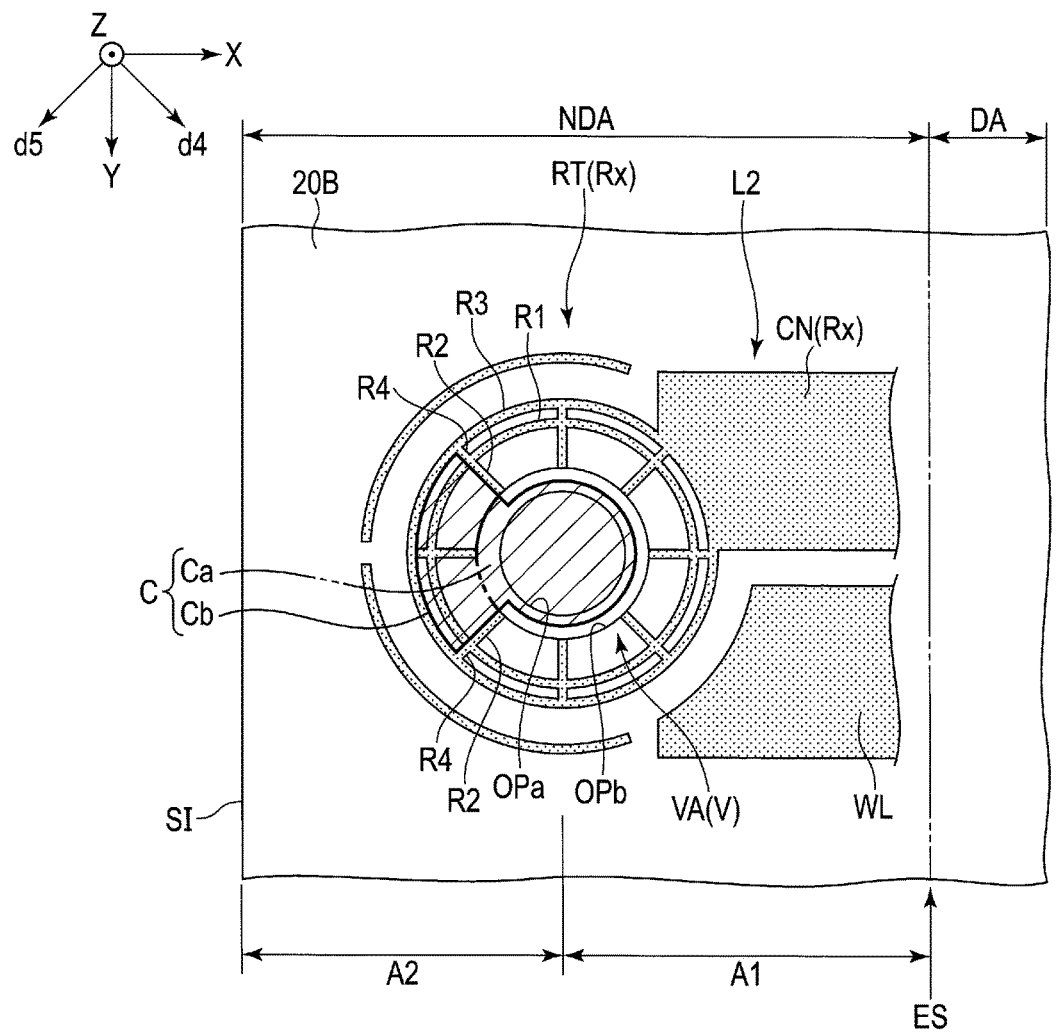
F I G. 10

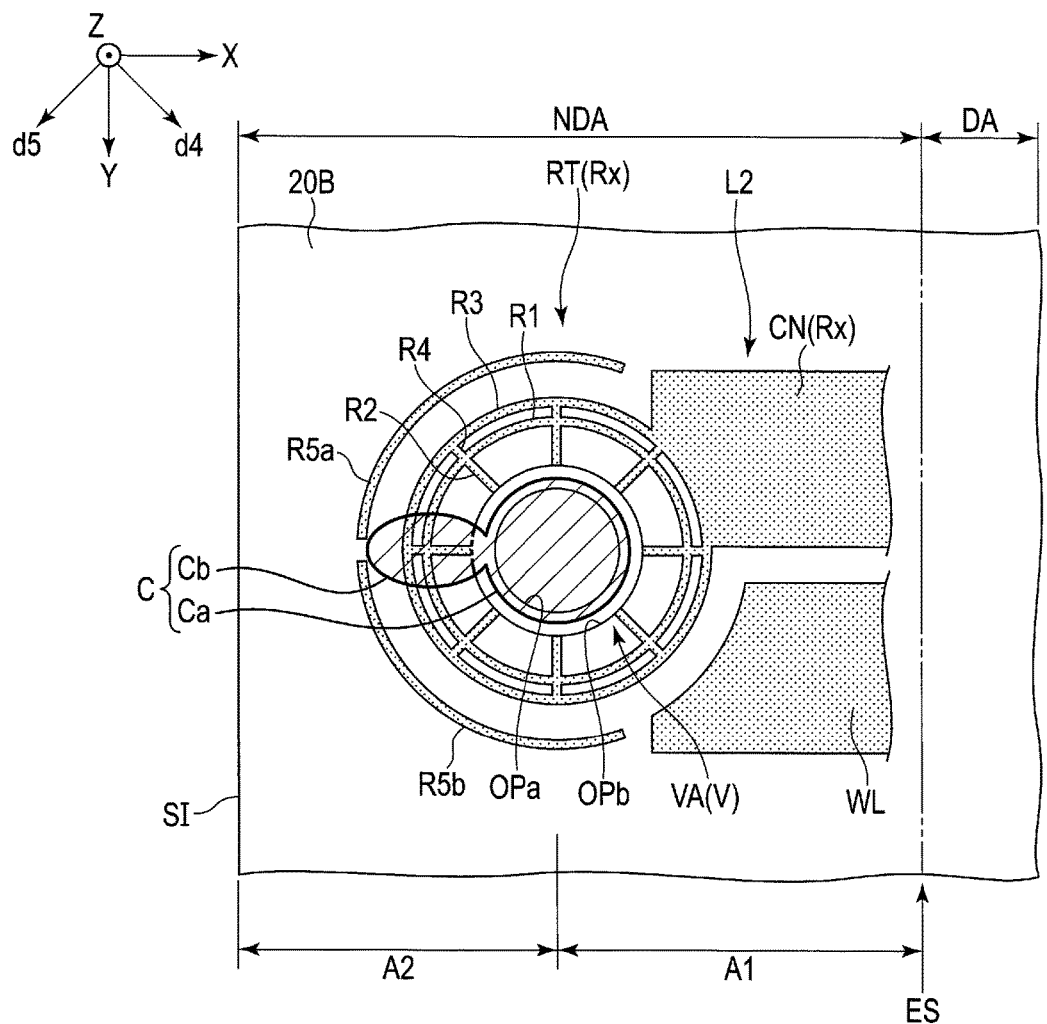
F I G. 11

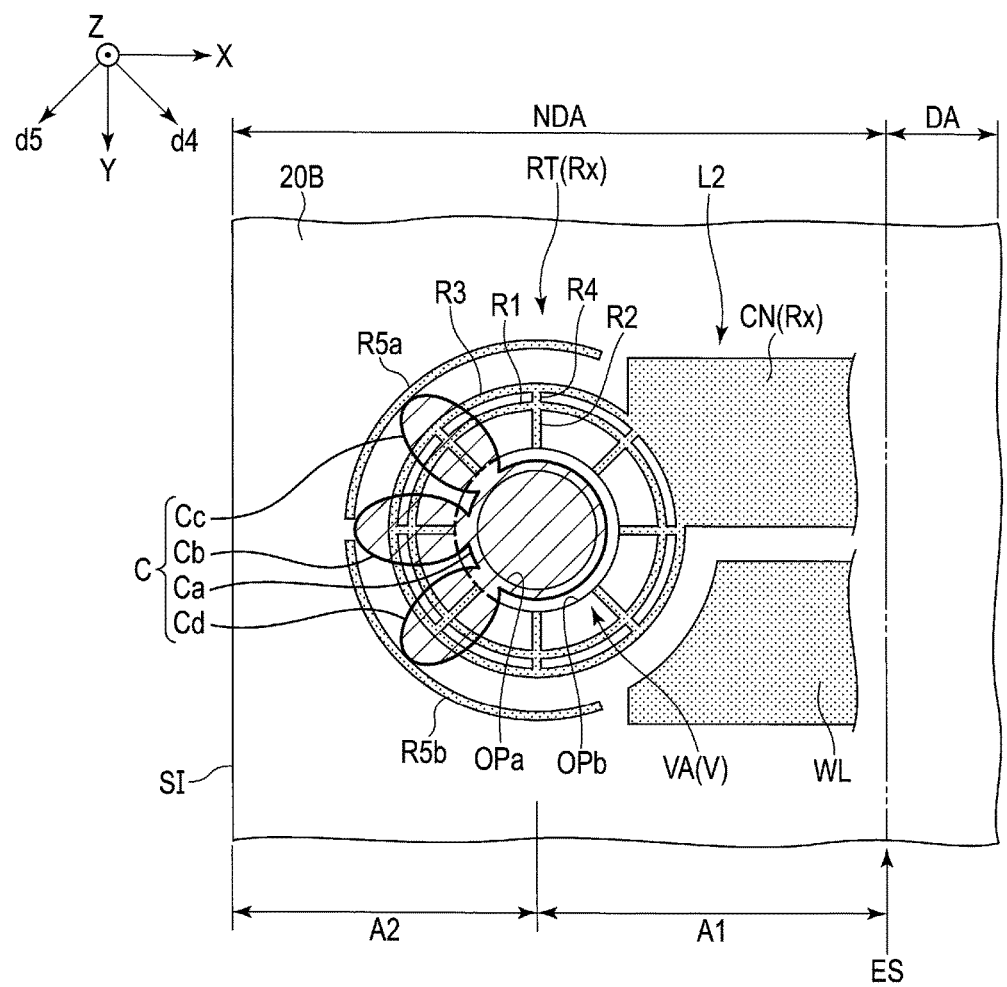
F I G. 12

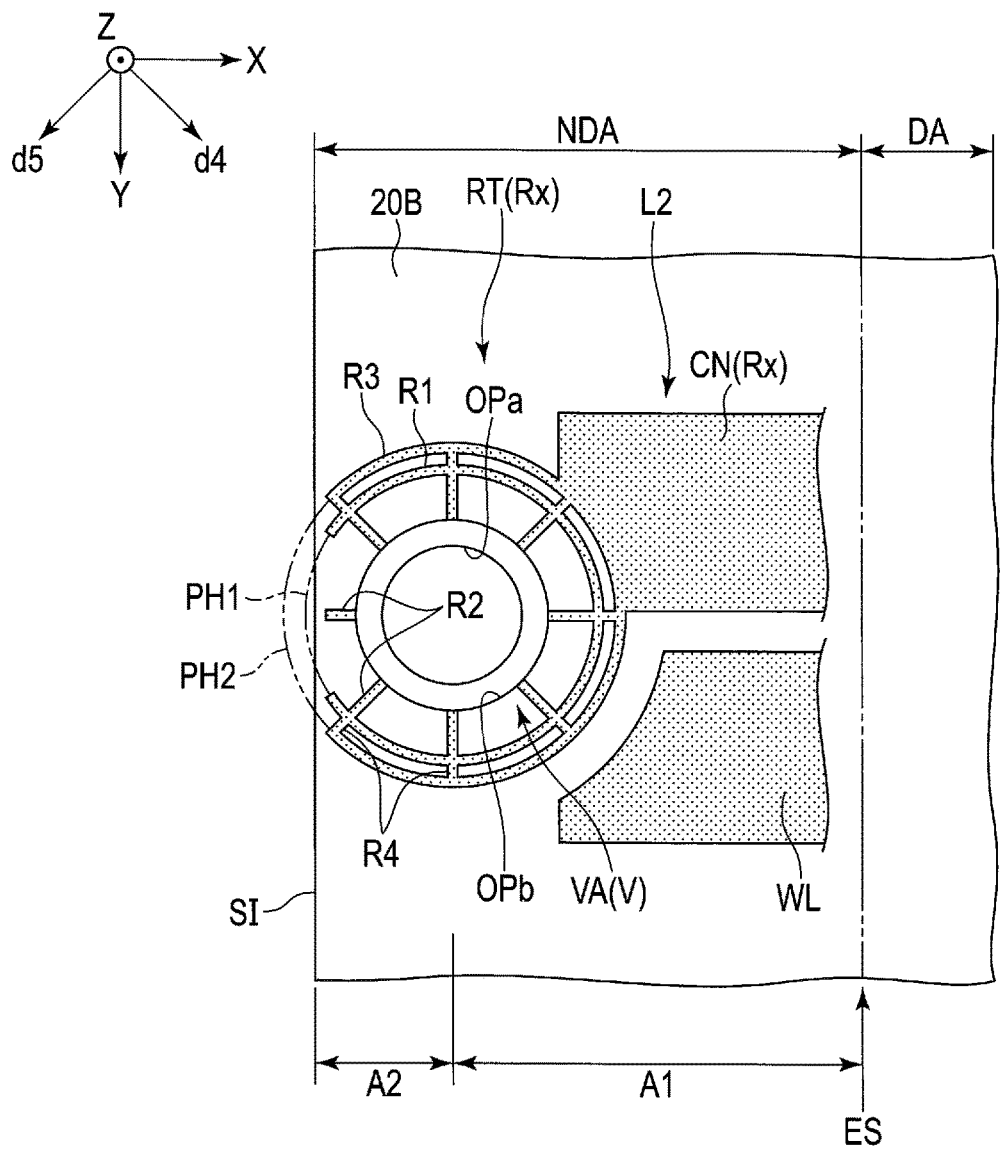
F I G. 13

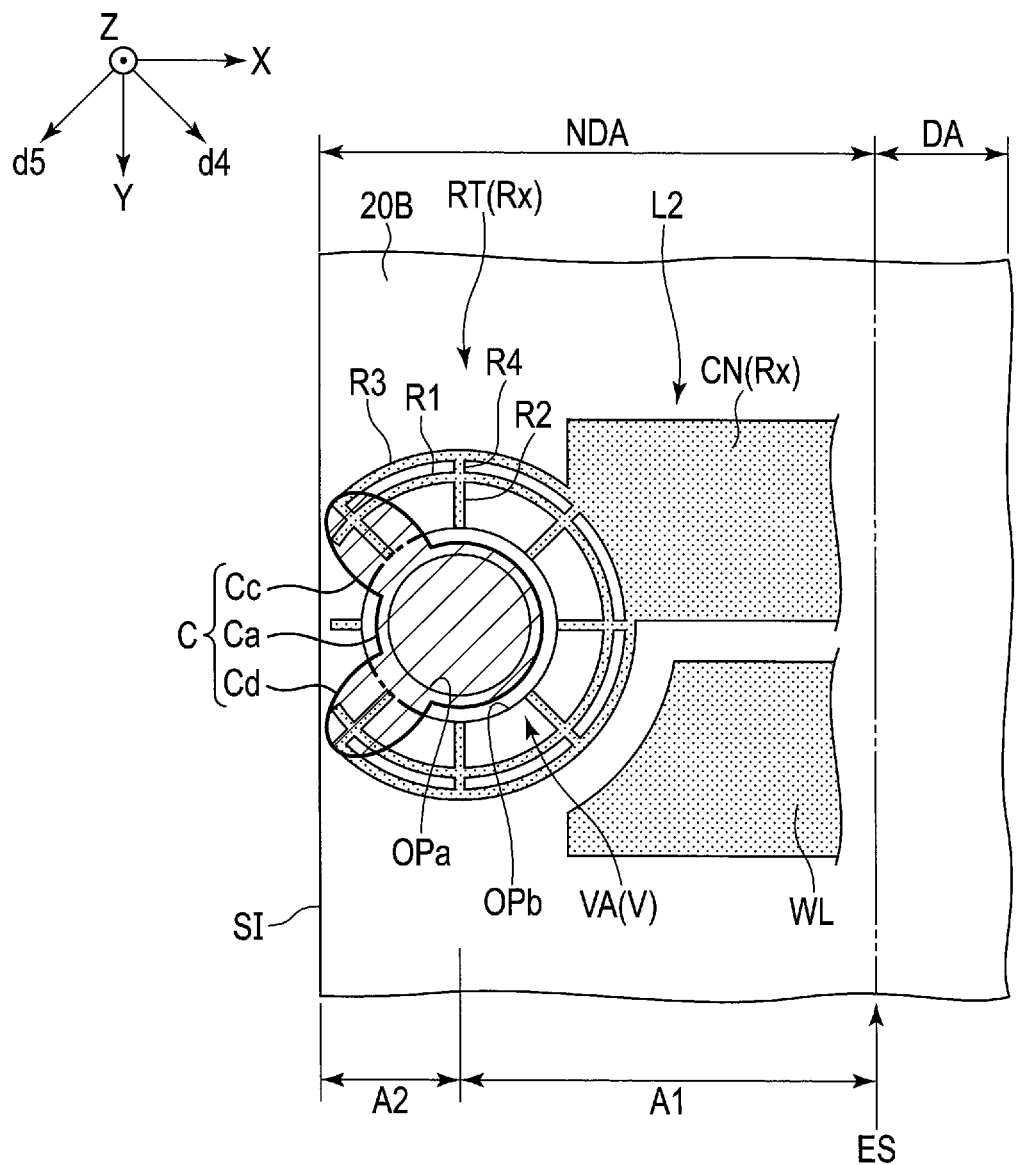
F I G. 14

DISPLAY DEVICE

CROSS-REFERENCE TO RELATED APPLICATIONS

This application is based upon and claims the benefit of priority from Japanese Patent Application No. 2017-009475, filed Jan. 23, 2017, the entire contents of which are incorporated herein by reference.

FIELD

Embodiments described herein relate generally to a display device.

BACKGROUND

In electronic devices such as display devices, there is a continuously increasing demand for further improving the efficiency of mounting wirings and reducing the cost thereof. For example, such a technique has been disclosed that a hole is formed in a CF-side substrate and the hole is filled with a connecting conductor, thereby forming a CF-side penetration electrode which connects a CF surface-side pattern formed on front and rear surfaces of the CF-side substrate and a CF-side rear surface conducting film to each other. However, in a liquid crystal display device as such, the connecting conductors filling into the hole may spread on the surface of the CF-side substrate over a desired range.

SUMMARY

The present application generally relates to a display device.

According to one embodiment, the display device includes a first substrate, a second substrate and a connecting material. The first substrate includes a first basement and a first conductive layer. The second substrate includes a second basement including a first surface, a second surface and a first hole located in the non-display area, and a second conductive layer provided on the second surface. The connecting material electrically connects the first conductive layer and the second conductive layer to each other via the first hole. The connecting material covers at least partially a portion of an opening edge belonging to the second region but does not cover a portion belonging to the first region.

BRIEF DESCRIPTION OF THE DRAWINGS

FIG. 1 is a plan view showing a configuration example of a display device of the first embodiment.

FIG. 3 is a cross section showing a display area of the display panel shown in FIG. 1.

FIG. 4 is a plan view showing a configuration example of a sensor according to the first embodiment.

FIG. 6 is a plan view showing a second conductive layer and a second surface shown in FIG. 5.

FIG. 7 is a diagram showing a modification of the second conductive layer shown in FIG. 6, which is a plan view showing a second conductive layer and a second surface.

FIG. 10 is a plan view showing a second conductive layer, a second surface and a connecting material according to a modification 1 of the first embodiment.

FIG. 11 is a plan view showing a second conductive layer, a second surface and a connecting material according to a modification 2 of the first embodiment.

FIG. 12 is a plan view showing a second conductive layer, a second surface and a connecting material according to a modification 3 of the first embodiment.

FIG. 13 is a plan view showing a second conductive layer and a second surface according to a modification 4 of the first embodiment.

FIG. 14 is a plan view showing a second conductive layer, a second surface and a connecting material according to the modification 4.

DETAILED DESCRIPTION

Figure 2:
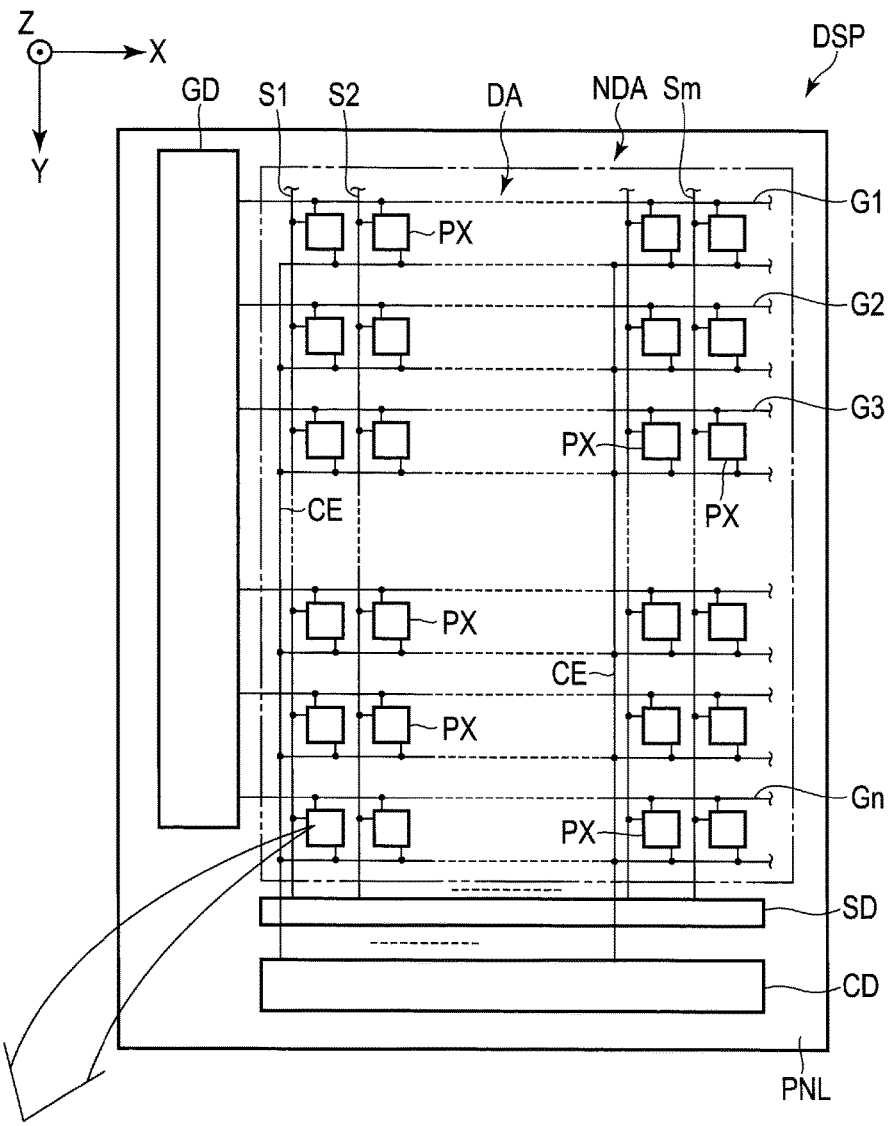
FIG. 2 is a plan view schematically showing a basic structure of a display panel shown in FIG. 1 and an equivalent circuit thereof.
Figure 2:
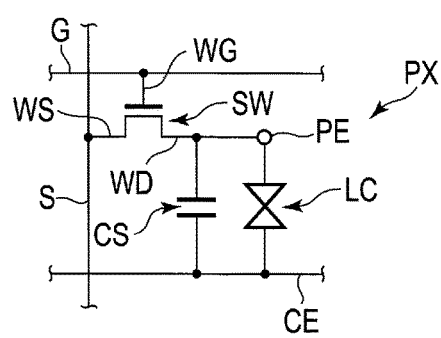

In general, according to one embodiment, there is provided a display device comprising a display panel including a display area and a non-display area provided along an outer edge of the display area. The display panel comprises a first substrate including a first basement and a first conductive layer, a second substrate including a second basement comprising a first surface opposing and located to be spaced from the first conductive layer, a second surface on an opposite side to the first surface, a first hole located in the non-display area and penetrating between the first surface and the second surface, and a second conductive layer provided on the second surface and a connecting material which electrically connects the first conductive layer and the second conductive layer to each other via the first hole. The non-display area comprises a first region located on a side of the display area with respect to a virtual line which passes through a center of the first hole and is parallel to a side edge of the outer edge of the display area, which opposes the first hole and a second region located on an outer side with respect to the virtual line. The connecting material covers at least partially a portion of an opening edge of the first hole on the side of the second surface, which belongs to the second region, but does not cover a portion belonging to the first region.

According to another embodiment, there is provided a display device comprising a display panel including a display area and a non-display area provided along an outer edge of the display area. The display panel comprises a first substrate including a first basement and a first conductive layer, a second substrate including a second basement comprising a first surface opposing and located to be spaced from the first conductive layer, a second surface on an opposite side to the first surface, a first hole located in the non-display area and penetrating between the first surface and the second surface, and a second conductive layer provided on the second surface and a connecting material which electrically connects the first conductive layer and the second conductive layer to each other via the first hole. The non-display area comprises a first region located on a side of the display area with respect to a virtual line and a second region located on an outer side with respect to the virtual line. The virtual line passes through a point of an opening edge of the first hole on a side of the second surface, which is most close to the display area and being parallel to a side edge of the outer edge of the display area, which opposes the first hole. The connecting material covers an opening edge of the first hole on the side of the second surface and is located above the second region of the second surface, but not located above the first region of the second surface.

According to another embodiment, there is provided a display device comprising a display panel including a display area and a non-display area provided along an outer edge of the display area and a light-shielding layer opposing the non-display area of the display panel. The display panel comprises a first substrate including a first basement and a first conductive layer, a second substrate including a second basement comprising a first surface opposing and located to be spaced from the first conductive layer, a second surface opposing the light-shielding layer and located on an opposite side to the first surface, and a second conductive layer provided on the second surface, an organic insulating layer located between the first conductive layer and the second basement, a contact hole comprising a first hole penetrating the second basement, a second hole penetrating the first conductive layer and opposing the first hole and a third hole penetrating the organic insulating layer and connected to the first hole and the second hole, which is covered by the light-shielding layer and a connecting material covered by the light-shielding layer and electrically connecting the first conductive layer and the second conductive layer via the contact hole. The non-display area comprises a first region located on a side of the display area with respect to a virtual line which passes through the first hole and is parallel to a side edge of the outer edge of the display area, which opposes the first hole and a second region located on an outer side with respect to the virtual line. The connecting material covers a portion of an opening edge of the first hole on the side of the second surface, which belongs to the second region, and is located above the second region of the second surface, but not located above the first region of the second surface.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

In each of the embodiments provided below, the display device can be used in various devices such as smartphones, tablet terminals, mobile phones, notebook computers, and game consoles. The main structure described in each embodiment is applicable to a liquid crystal display device, a self-luminous display device such as an organic electroluminescent display device, an electronic paper display device comprising an electrophoresis element, etc., a display device adopting micro-electromechanical systems (MEMS), and a display device adopting electrochromism.

Each of the embodiments provided below is applicable to various display devices having a conductive structure between basements, in which a first basement and a second basement are disposed to be spaced apart from each other with a gap, and the second basement comprises a hole, and a first conductive layer located in the first basement and a second conductive layer located in the second basement are electrically connected to each other through the hole.

First Embodiment

The first embodiment will now be described. FIG. 1 is a plan view showing an example of a display device DSP of the first embodiment. While a first direction X, a second direction Y and a third direction Z are orthogonal to each other, they may cross each other at an angle other than 90 degrees. The first direction X and the second direction Y correspond to the directions parallel to the surface of a substrate which constitutes the display device DSP, and the third direction Z corresponds to the thickness direction of the display device DSP. Here, as an example of the display device DSP, a liquid crystal display device comprising a sensor SS will be described.

As shown in FIG. 1, the display device DSP comprises a display panel PNL, an IC chip 1, a circuit board (wiring substrate) 3, a back-light unit BL, which will be described later, etc. The display panel PNL is a liquid crystal display panel, which comprises a first substrate SUB1, a second substrate SUB2, a sealing member SE and a liquid crystal layer LC. The second substrate SUB2 opposes the first substrate SUB1 in the third direction Z. The sealing member SE corresponds to the part indicated by upward-sloping hatch lines in FIG. 1, and bonds the first substrate SUB1 and the second substrate SUB2 to each other. The liquid crystal layer LC is located in a space between the first substrate SUB1 and the second substrate SUB2 within an enclosed surface of the sealing member SE.

In the following description, the direction towards the second substrate SUB2 from the first substrate SUB1 is referred to as up and the direction towards the first substrate SUB1 from the second substrate SUB2 is referred to as down. Moreover, the view toward the first substrate SUB1 from the second substrate SUB2 is referred to as plan view.

The display panel PNL comprises a display area DA which displays images and a non-display area NDA provided along outer edges of the display area DA. The display area DA is located within a region surrounded by the sealing member SE. The non-display area NDA is a frame-shaped area surrounding the display area DA and adjacent thereto. The sealing member SE is located in the non-display area NDA.

The circuit board 3 is mounted on the first substrate SUB1. The circuit board 3 is, for example, a flexible substrate having flexibility. Note that it suffices if the flexible substrate applicable to this embodiment only comprises a flexible portion at least partially, which is formed from a bendable material. For example, the circuit board 3 of this embodiment may be a flexible substrate formed as a flexible member in its entirety, or may be a rigid-flexible substrate comprising a rigid part formed from a hard material such as glass epoxy and a flexible part formed from a bendable material such as polyimide.

The IC chip 1 is mounted on the circuit board 3 in the example shown in FIG. 1. But not limited to this, the IC chip 1 may be mounted on a portion of the first substrate SUB1, which projects outside from the second substrate SUB2, or may be mounted on an external circuit board connected to the circuit board 3. The IC chip 1 comprises, for example, a built-in display driver DD, which outputs signals necessary to display images. The display driver DD may include at least a part of, for example, a signal line drive circuit SD, a scanning line drive circuit GD and a common electrode drive circuit CD, which will be described later. In the example shown in FIG. 1, the IC chip 1 further comprises a built-in detector RC which functions as a touch-panel controller and the like. The detector RC may be built in an IC chip other than the IC chip 1.

The display panel PNL may be, for example, a transmissive display panel having a transmissive display function, which displays images by selectively transmitting the light from below the first substrate SUB1 or a reflective display panel having a reflective display function, which displays images by selectively reflecting the light from above the second substrate SUB2. Or it may be a transreflective display panel having both the transmissive display function and the reflective display function.

The sensor SS is configured to carry out sensing for detecting contact or approaching of a detection object to the display device DSP. The sensor SS comprises a plurality of detection electrodes Rx (Rx1, Rx2, Rx3, Rx4, . . . ). The detection electrodes Rx are provided on the second substrate SUB2. The detection electrodes Rx each extend in the first direction X, and are arranged along the second direction Y with a gap between adjacent pair thereof. The detection electrodes Rx each comprise body portions RS and connectors CN. The detection electrodes Rx comprise terminals RT (RT1, RT2, RT3, RT4, . . . ), respectively.

The body portions RS are located in the display area DA and extend in the first direction X. In the detection electrodes Rx, mainly, the body portions RS are used for the sensing. For example, the body portions RS can be each formed into a belt-like shape from an aggregate of very fine metal thin wires. In the example shown in FIG. 1, each detection electrode Rx comprises two body portions RS, but it may comprise three or more body portions RS or may comprise only one body portion RS.

Moreover, between each adjacent pair of body portions RS, a dummy region is provided, in which metal thin wires are provided in substantially the same arrangement as that of the body portions RS. The metal thin wires of the dummy regions are not connected to any of the wirings, and therefore they are placed electrically in a floating state.

The connectors CN of each detection electrode Rx are located respectively in one end side and another end side of the non-display area NDA along the first direction X to connect a plurality of body portions RS to each other while being connected to the respective terminals RT. In FIG. 1, the one end side corresponds to the portion further left from the display area DA and the other end side corresponds to the portion further right from the display area DA. At least part of the terminals RT is located to overlap the sealing member SE in plan view. The terminals RT are located respectively in the one end side and the other end side of the non-display area NDA.

The first substrate SUB1 comprises pads P (P1, P2, P3, P4, . . . ) and wirings W (W1, W2, W3, W4, . . . ). The pads P and the wirings W are located respectively in the one end side and the other end side of the non-display area NDA and overlap the sealing member SE in plan view. The pads P are located to overlap the terminals RT in plan view. The wirings W are connected respectively to the pads P and extend in the second direction Y and the first direction X to be electrically connected to the detector RC of the IC chip 1 via the circuit board 3.

Contact holes V (V1, V2, V3, V4, . . . ) are formed at positions where the terminals RT and the pads P oppose each other, respectively. Further, the contact holes V penetrate the second substrate SUB2 including the terminals RT and the sealing member SE, and may penetrate even the pads P. In the example shown in FIG. 1, the contact holes V have a perfect circular shape in plan view, but the shape is not limited to this. It may be some other circular shape such as elliptical, or may be a shape other than circular. The terminals RT are formed one size greater than the contact holes V. The shape of the terminals RT of this embodiment will be explained in detail later.

The contact holes V are each provided with a connecting material C, which will be described later and the terminals RT of the detection electrodes Rx and the pads P are electrically connected to each other via the connecting materials C. The pads P and the wirings W are an example of a first conductive layer L1 provided in the first substrate SUB1. Further, the detection electrodes Rx are an example of a second conductive layer L2 provided in the second substrate SUB2 located apart from the first substrate SUB1.

The detection electrodes Rx connected to the pads P are electrically connected to the detector RC via the circuit board 3 connected to the first substrate SUB1. The detector RC reads sensor signals output from the detection electrodes Rx, and detects if a detection object contacts or approaches, and the position coordinate of the detection object, etc.

In the example shown in FIG. 1, the terminals RT (RT1, RT3, . . . ) of the odd-numbered detection electrodes Rx (Rx1, Rx3, . . . ), the pads P (P1, P3, . . . ), the wirings W (W1, W3, . . . ) and the contact holes V (V1, V3, . . . ) are all located in the one end side of the non-display area NDA. On the other hand, the terminals RT (RT2, RT4, . . . ) of the even-numbered detection electrodes Rx (Rx2, Rx4, . . . ), the pads P (P2, P4, . . . ), the wirings W (W2, W4, . . . ) and the contact holes V (V2, V4, . . . ) are all located in the other end side of the non-display area NDA. According to such a layout, the width of the one end side of the non-display area NDA and that of the other end side can be equalized, which is favorable for narrowing the frame.

With such a layout that the pad P3 is closer to the circuit board 3 than the pad P1 as shown in FIG. 1, the wiring W1 is disposed along an inner side of the wiring W3 between the pad P3 and the circuit board 3 while detouring the inner side of the pad P3, which is the side closer to the display area DA. Similarly, the wiring W2 is disposed along an inner side of the wiring W4 between the pad P4 and the circuit board 3 while detouring the inner side of the pad P4.

FIG. 2 is a plan view schematically showing a basic structure of the display panel PNL shown in FIG. 1 and an equivalent circuit thereof.

As shown in FIG. 2, the display panel PNL comprises a plurality of pixels PX in the display area DA. Here, the term "pixel" indicates a minimum unit which is individually controllable according to a pixel signal, and includes a switching element provided in a position in which a scanning line and a signal line, which will be described later, cross each other. The pixels PX are arranged in a matrix in the first direction X and the second direction Y. In addition, the display panel PNL includes a plurality of scanning lines G (G1 to Gn), a plurality of signal lines S (S1 to Sm), a common electrode CE and the like in the display area DA.

The scanning lines G extend in the first direction X and are arranged in the second direction Y The signal lines S extend in the second direction Y and are arranged in the first direction X. The scanning lines G and the signal lines S do not necessarily extend linearly but may be partially bent. The common electrode CE is shared by a plurality of pixels PX.

The scanning lines G, the signal lines S and the common electrode CE are each drawn out to the non-display area NDA. The scanning lines G are connected to the scanning line drive circuit GD in the non-display area NDA. Further, the signal lines S are connected to the signal line drive circuit SD in the non-display area NDA. Furthermore, the common electrode CE is connected to the common electrode drive circuit CD. The signal line drive circuit SD, the scanning line drive circuit GD and the common electrode drive circuit CD may be formed on the first substrate SUB1, or all or some of these may be built in the IC chip 1 shown in FIG. 1.

Each pixel PX comprises a switching element SW, a pixel electrode PE, a common electrode CE, a liquid crystal layer LC and the like. The switching element SW is formed from, for example, a thin film transistor (TFT) and is electrically connected to a respective scanning line G and a respective signal line S. More specifically, the switching element SW comprises a gate electrode WG, a source electrode WS and a drain electrode WD. The gate electrode WG is electrically connected to the scanning line G. In the example shown in FIG. 2, the electrode electrically connected to the signal line S is the source electrode WS. Moreover, the electrode electrically connected to the pixel electrode PE is the drain electrode WD.

The scanning line G is connected to the switching element SW of each of the pixels PX arranged in the first direction X. The signal line S is connected to the switching element SW of each of the pixels PX arranged in the second direction Y. Each of the pixel electrodes PE opposes the common electrode CE. Liquid crystal molecules of the liquid crystal layer LC are driven (twisted) by the electric field produced between the pixel electrode PE and the common electrode CE. A storage capacitor CS is formed between the common electrode CE and the pixel electrode PE, for example.

FIG. 3 is a cross section of the display device DSP taken along the first direction X in the display area DA. In the example shown in FIG. 3, the display panel PNL has a structure provided for the display mode which mainly uses a lateral electric field substantially parallel to the X-Y plane. The display panel PNL may have a structure provided for display mode using a vertical electric field perpendicular to the X-Y plane, or an electric field oblique to the X-Y plane, or a combination thereof.

To the display mode using a lateral electric field, for example, such a structure is applicable, that both of the pixel electrode PE and the common electrode CE are provided on one of the first substrate SUB1 and the second substrate SUB2. To the display mode using a vertical electric field or an oblique electric field, for example, such a structure is applicable, that one of the pixel electrode PE and the common electrode CE is provided on the first substrate SUB1, and the other one of the pixel electrode PE and the common electrode CE is provided on the second substrate SUB2.

The first substrate SUB1 comprises a first basement 10, the signal lines S, the common electrode CE, metal layers M, the pixel electrodes PE, a first insulating layer 11, a second insulating layer 12, a third insulating layer 13, a first alignment film AL1, and the like. The first basement 10 comprises a third surface 10A opposing the second substrate SUB2 and a fourth surface 10B on a side opposite to the third surface 10A. In FIG. 3, the switching elements, scanning lines, and various insulating layers interposed between these are not illustrated. The first insulating layer 11 is located on the third surface 10A of the first basement 10.

A semiconductor layer of the scanning lines and the switching elements, which are not illustrated, is located between the first basement 10 and the first insulating layer 11. The signal lines S are located on the first insulating layer 11. The second insulating layer 12 is located on the signal lines S and the first insulating layer 11. The common electrode CE is located on the second insulating layer 12.

The metal layers M are in contact with the common electrode CE directly above the signal lines S, respectively. In the example shown in FIG. 3, the metal layers M are located on the common electrode CE. Note that the metal layers M may be located between the common electrode CE and the second insulating layer 12. The third insulating layer 13 is located on the common electrode CE and the metal layers M. The pixel electrodes PE are located on the third insulating layer 13 such as to oppose the common electrode CE. Further, the pixel electrodes PE comprise a slit SL in a position opposing the common electrode CE. The first alignment film AL1 covers the pixel electrodes PE and the third insulating layer 13.

The scanning lines G, the signal lines S and the metal layers M are each formed from a metal material such as molybdenum, tungsten, titanium or aluminum. The scanning lines G, the signal lines S and the metal layers M each may be formed in a single- or multi-layer structure. The common electrode CE and the pixel electrodes PE are each formed of a transparent conductive material such as indium tin oxide (ITO) or indium zinc oxide (IZO). The first insulating layer 11 and the third insulating layer 13 are inorganic insulating layers while the second insulating layer 12 is an organic insulating layer.

The configuration of the first substrate SUB1 is not limited to the example illustrated in FIG. 3, but the pixel electrodes PE may be located between the second insulating layer 12 and the third insulating layer 13 and the common electrode CE may be located between the third insulating layer 13 and the first alignment film AL1. In such a case, the pixel electrodes PE are formed into a plate shape which does not comprise a slit. Further, the common electrode CE comprises slits opposing the pixel electrodes PE, respectively.

Further, both of the pixel electrodes PE and the common electrode CE may be formed into a shape of teeth of a comb and be arranged to engage with each other in plan view.

The second substrate SUB2 comprises a second basement 20, a light-shielding layer BM, color filter CF, an overcoat layer OC, a second alignment film AL2 and the like. The second basement 20 comprises a first surface 20A opposing the first substrate SUB1 and a second surface 20B on a side opposite to the first surface 20A. In this embodiment, the first basement 10 and the second basement 20 are each formed from glass. But, besides this embodiment, each of the first basement 10 and the second basement 20 may be formed from resin.

The light-shielding layer BM and the color filter CF are located in a first surface 20A side of the second basement 20. The light-shielding layer BM partitions the pixels from each other and is located directly above the signal lines S. The color filter CF opposes the pixel electrodes PE and partially overlaps the light-shielding layer BM. The color filter CF includes a red colored layer, a green colored layer, a blue colored layer and the like. The overcoat layer OC covers the color filter CF. The second alignment film AL2 covers the overcoat layer OC.

Note that the color filter CF may be disposed on the first substrate SUB1. The color filter CF may include four or more color filters. For white pixel, a white or colorless layer may be arranged, or an overcoat layer OC may be provided in place of the layer.

The first polarizer PL1 is located between the first basement 10 and the backlight BL. The second polarizer PL2 is located above the detection electrodes Rx provided on the second surface 20B of the second basement 20. The first polarizer PL1 and second polarizer PL2 may be provided a retardation film or the like, attached thereto if needed.

Next, a configuration example of the sensor SS provided in the display device DSP of this embodiment will be described.

As shown in FIG. 4, the sensor SS is of, for example, a mutual capacitive type and able to detect contact or approach of a detection object based on a change in electrostatic capacitance between a pair of electrodes opposing each other via a dielectric. The sensor SS is, for example, an in-cell type touch panel.

The sensor SS comprises sensor drive electrodes Tx and the detection electrodes Rx. In the example shown in FIG. 4, the sensor drive electrodes Tx correspond to the part indicated by downward-sloping hatch lines and are provided on the first substrate SUB1, whereas the detection electrodes Rx correspond to the part indicated by upward-sloping hatch lines and are provided on the second substrate SUB2. The sensor drive electrodes Tx and the detection electrodes Rx cross each other in the X-Y plane. The detection electrodes Rx oppose the sensor drive electrodes Tx in the third direction Z.

The sensor drive electrode Tx and the detection electrodes Rx are located in the display area DA and partially extend to the non-display area NDA. In the example illustrated in FIG. 4, the sensor drive electrodes Tx are formed into a belt-like-shape and elongated in the second direction Y, and are arranged in the first direction X at intervals. The body portions RS of detection electrodes Rx each extend in the first direction X and are arranged in the second direction Y at intervals. The terminals RT of the detection electrodes Rx each extend in the first direction X and are arranged in the second direction Y at intervals. The terminals RT of the detection electrodes Rx are electrically connected to the pads P by an inter-substrate conducting structure, which will be described later, and connected with the detector RC via the wirings W.

Each of the sensor drive electrode Tx is electrically connected to the common electrode drive circuit CD via the respective wiring WR. Note that the number, size and shape of the sensor drive electrodes Tx and the detection electrodes Rx are not particularly limited, but may be changed in various ways. A plurality of sensor drive electrodes Tx constitute the common electrode CE, for example. The sensor drive electrodes Tx each have a function of producing an electric field between the respective pixel electrode PE and itself and a function of detecting the position of a detection object by producing a capacitance between the respective detection electrode Rx and itself.

At a display drive period when an image is to be displayed on the display area DA, the common electrode drive circuit CD supplies a common drive signal to the sensor drive electrodes Tx including the common electrode CE. At a sensing drive period when sensing is to be executed, the common electrode drive circuit CD supplies a sensor drive signal to the sensor drive electrodes Tx. As the sensor drive signal is supplied to the sensor drive electrodes Tx, the detection electrodes Rx output a sensor signal necessary for sensing, that is, a signal based on a change in inter-electrode capacitance between the sensor drive electrodes Tx and the detection electrodes Rx. The sensor signal output from the detection electrodes Rx is input to the detection circuit RC shown in FIG. 1.

Note that the sensor SS is not limited to the mutual-capacitance sensor, which detects a detection object based on a change in capacitance between a pair of electrodes, that is, a capacitance between a sensor drive electrode Tx and a detection electrode Rx, but may be a self-capacitance sensor, which detects a detection object based on a change in capacitance of the detection electrode Rx itself.

Figure 5:
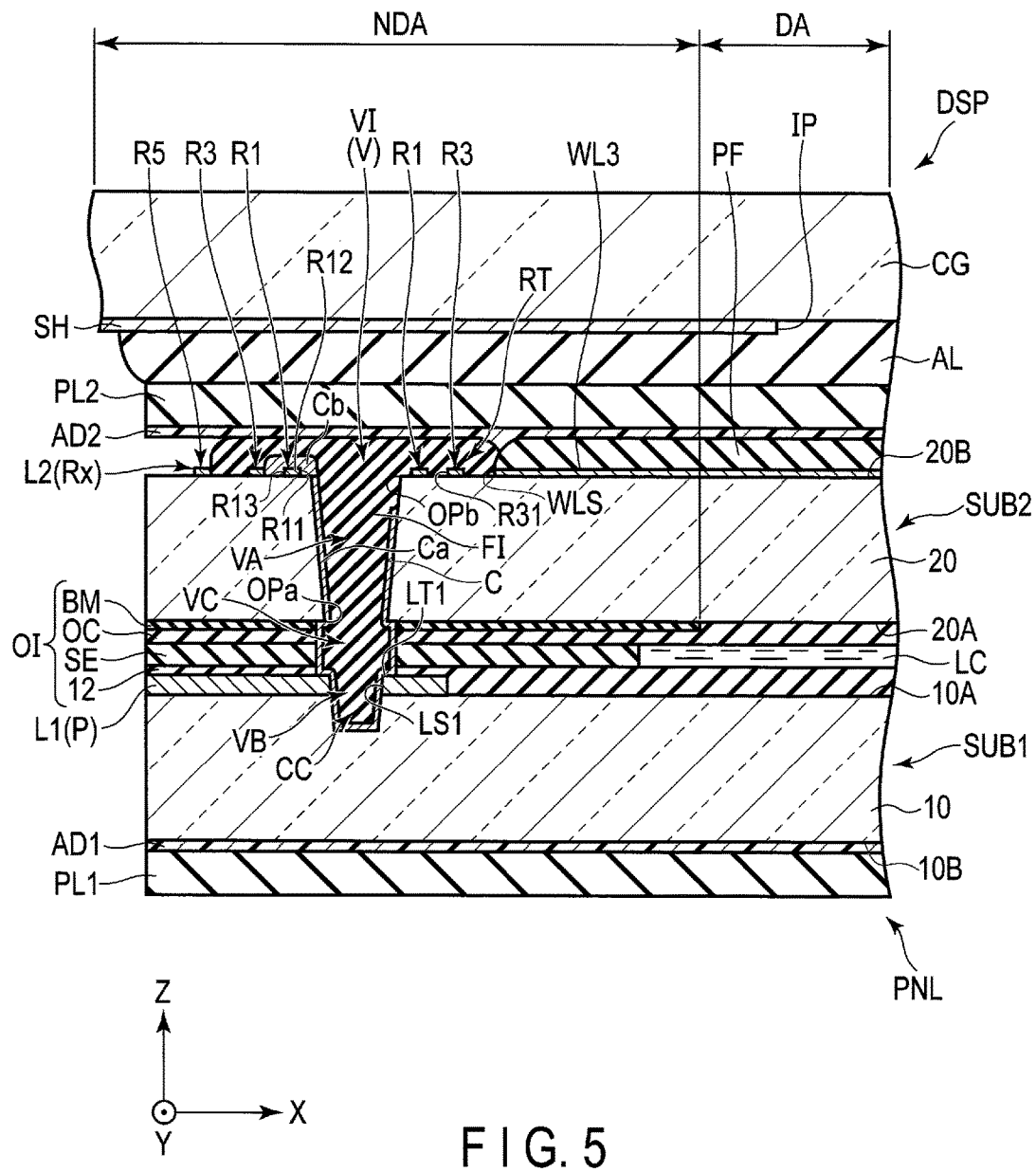
FIG. 5 is a cross section of the display device taken along line V-V in FIG. 1.

Next, the contact hole V (V1, V2, V3, V4, . . . ) will be described. FIG. 5 is a schematic cross-sectional view of the display device DSP taken along the line V-V in FIG. 1.

As shown in FIG. 5, the display device DSP includes the first substrate SUB1, the second substrate SUB2, an organic insulating layer OI, the connecting material C, the first polarizer PL1, the second polarizer PL2 and a cover member CG. The first polarizer PL1 is adhered to the first substrate SUB1 by an adhesive layer AD1. The second polarizer PL2 is adhered to the second substrate SUB2 by an adhesive layer AD2.

The first substrate SUB1 includes the first basement 10 and the first conductive layer L1. The first conductive layer L1 includes the pads P (P1, P2, P3, P4, . . . ) and the wirings W (W1, W2, W3, W4, . . . ) and is located on a third surface 10A side opposing the second substrate SUB2. The first insulating layer 11 shown in FIG. 3, some other insulating layer or some other conductive layer may be provided between the first basement 10 and the pads P, and between the first basement 10 and the second insulating layer 12.

The second substrate SUB2 includes the second basement 20 and the second conductive layer L2. The first surface 20A of the second basement 20 opposes the first conductive layer L1 and is spaced apart from the first conductive layer L1 in the third direction Z. The second conductive layer L2 includes the detection electrodes Rx, that is, the terminals RT (RT1, RT2, RT3, RT4, . . . ), the connectors CN, and the body portions RS. The second conductive layer L2 is located on a second main surface 20B side and is covered by the protection material PF. In other words, the first basement 10, the first conductive layer L1, the second basement 20, the second conductive layer L2 and the protection material PF are arranged in the third direction Z in this order.

The organic insulating layer OI is located between the first conductive layer L1 and the second basement 20. In place of the organic insulating layer OI, an inorganic insulating layer or some other conductive layer may be located, or an air layer may be located. Note that various insulating layers and various conductive layers may be provided between the second basement 20 and the second conductive layer L2 or on the second conductive layer L2.

For example, the organic insulating layer OI includes the sealing member SE for bonding the first substrate SUB1 and the second substrate SUB2 to each other, the second insulating layer 12 of the first substrate SUB1, the light-shielding layer BM and the overcoat layer OC of the second substrate SUB2 and the like. The sealing member SE is located between the second insulating layer 12 and the overcoat layer OC. The liquid crystal layer LC is located in a gap between the first substrate SUB1 and the second substrate SUB2 and is enclosed by the sealing member SE.

Note that between the second insulating layer 12 and the sealing member SE, the metal layers M, the third insulating layer 13 and the first alignment film ALL shown in FIG. 3 may be interposed. The second alignment film AL2 shown in FIG. 3 may be interposed between the overcoat layer OC and the sealing member SE.

The first and second basements 10 and 20 are formed from, for example, alkali-free glass or transparent resin. The protection material PF is formed from, for example, an organic insulating material such as acrylic resin. The first and second conductive layers L1 and L2 are formed from, for example, a metal material such as molybdenum, tungsten, titanium, aluminum, silver, copper or chromium, an alloy containing any of these metal materials or a transparent conductive material such as ITO or IZO. The first and second conductive layers L1 and L2 may be of a single layer or multilayer structure.

In the second substrate SUB2, the first hole VA which penetrates the second conductive layer L2 (the detection electrodes Rx) and the second basement 20 is formed in the terminals RT located in the non-display area NDA. The first hole VA comprises an opening edge OPa on a first surface 20A side and an opening edge OPb on a second surface 20B side. In the example shown in FIG. 5, the second conductive layer L2 is not present in a position which overlaps the first hole VA, and therefore the first hole VA is formed so as to penetrate the second basement 20 from the second surface 20B to the first surface 20A.

The display device DSP comprises, in addition to the first hole VA, a second hole VB which penetrates the first conductive layer L1, a third hole VC which penetrates each portions of the organic insulating layer OI and a concavity CC formed in the first basement 10. The concavity CC, the second hole VB, the third hole VC and the first hole VA are communicated to each other to form the contact hole V. The second hole VB penetrates the first conductive layer L1 in the pads P, and opposes the first hole VA in the third direction Z. The third hole VC includes a hole which penetrates the second insulating layer 12, a hole which penetrates the sealing member SE, a hole which penetrates the light-shielding layer BM and the overcoat layer OC, and the like.

The third hole VC formed in the organic insulating layer OI is expanded in the first direction X as compared to the first hole VA and the second hole VB. Note that the third hole VC is expanded not only in the first direction X but in all the directions on the X-Y plane more than the first hole VA and the second hole VB. With this structure, the first conductive layer L1 comprises an upper surface LT1 near the second hole VB, which is not covered by the organic insulating layer OI.

The concavity CC is opened in the third surface 10A of the first basement 10 and does not penetrate the first basement 10. The concavity CC has opposes the third hole VC in the third direction Z. For example, the depth of the concavity CC in the third direction Z is about ⅕ to about ½ of the thickness of the first basement 10 in the third direction Z.

All of the second and third holes VB and VC and the concavity CC are located directly under the first hole VA. The contact hole V can be formed by irradiating laser light or etching from above the second substrate SUB2. The organic insulating layer OI including various members, in which the third hole VC is provided, is formed from, for example, a material having a melting point lower than that of the second basement 20 in which the first hole VA is provided, and the first conductive layer L1 in which the second hole VB is provided. Alternatively, it is formed from an easily etchable material.

In the contact hole V, the connecting material C is disposed. The layers in which the connecting material C and the contact hole V are formed, namely, the first substrate SUB1, the second substrate SUB2 and the organic insulating layer OI constitute an inter-substrate conducting structure according to this embodiment. The connecting material C should preferably contain, for example, a metal material such as silver and a material in which particulates of the metal material whose particle diameter is of the order of several to tens of nanometers are mixed in a solvent.

The connecting material C electrically connects the first conductive layer L1 and the second conductive layer L2 to each other, which are provided respectively in different substrates via the contact hole V. The connecting material C comprises a first portion Ca located inside the contact hole V and a second portion Cb located outside the contact hole V. The first portion Ca covers a circumferential surface and the like of the first hole VA. An upper portion of the first portion Ca may be lost. The second portion Cb partially covers the opening edge OPb of the first hole VA and is located above the second surface 20B. In the example shown in FIG. 5, the connecting material C and the first conductive layer L1 are located in such positions in relation to each other that the connecting material C is in contact with a circumferential surface LS1 of the respective pad P in the second hole VB and an upper surface LT1 of the respective pad P. The connecting material C and the second conductive layer L2 are located in such positions in relation to each other that the connecting material C is in contact with each of an inner circumferential surface R11, an upper surface R12 and an outer circumferential surface R13 of a first projection R1, which will be described later. Note that above the second surface 20B, the connecting material C is not formed in the region between the first hole VA and the display area DA.

In the example shown in FIG. 5, the connecting material C is in contact with the circumferential surfaces of all of the first hole VA, the second hole VB, the third hole VC and the concavity CC, but the portions near the center of these holes is not filled with the connecting material C. More specifically, the connecting material only covers these circumferential surfaces as a film, but the film itself is thin.

The holes are filled with a filling material FI to bury hollow portions of the holes. The filling material FI is formed from a material similar to that of the protection material PF, for example. Unlike the connecting material C, the filling material FI may be formed in a region between the first hole VA and the display area DA above the second surface 20B. Note that the connecting material C may be formed such as not to include a hollow portion.

The connecting material C is formed continuously between the first conductive layer L1 and the second conductive layer L2 without intervals. Thus, the second conductive layer L2 is electrically connected to the circuit board 3 via the connecting material C and the first conductive layer L1. Therefore, a control circuit, which writes signals to the second conductive layer L2 or reads signals output from the second conductive layer L2 is connectable to the second conductive layer L2 via the circuit board 3. With this structure, it is no longer necessary to provide a separate circuit board for the second substrate SUB2 to connect the second conductive layer L2 to the control circuit.

The cover member CG is of a flat type and formed from a transparent insulating material such as glass or acrylic resin. The cover member CG is formed into a rectangular plate shape. In an X-Y plan view, the cover member CG has a width and a length greater than dimensions (width and length) of the display panel PNL and has an area greater than that of the display panel PNL. The cover member CG is formed on and over the display area DA and the non-display area NDA, thus covering the entire surface of the display panel PNL.

The light-shielding layer SH is formed on a surface of the cover member CG, which is on a side opposing the display panel PNL. The light-shielding layer SH is disposed on the non-display area NDA. The light-shielding layer SH covers the contact hole V, the connecting material C and the like. In this embodiment, the display area DA is formed into a rectangular shape, and the non-display area NDA is formed into a rectangular frame shape. With this structure, the light-shielding layer SH is formed into a rectangular frame shape, for example. The light-shielding layer SH is formed using a printing method, which employs, for example, a black resin as the light-shielding material. Therefore, the light-shielding layer SH forms a step (a level difference by printing) on the surface of the cover member CG, which is on the side opposing the display panel PNL.

The cover member CG which includes the light-shielding layer SH is adhered to the second polarizer PL2 with an adhesive layer AL. The adhesive layer AL is formed from, for example, an optically clear resin (OCR). The adhesive layer AL has substantially a uniform thickness all over the region. Here, the light reflection can be reduced in each interface and a higher contrast can be achieved as compared to the case without the adhesive layer AL, that is, the case where an air layer is present between the display panel PNL and the cover member CG.

Moreover, the adhesive layer AL is formed to have at least a certain thickness. Thus, it is possible to suppress the formation of air bubbles in the space between the display panel PNL and the cover member CG, especially, near the step (level difference) described above.

As described above, the adhesive layer AL has at least a certain thickness. With this structure, it is considered that the connecting material C may, for example, reflect external light to be viewable to the user depending on the accuracy of alignment between the cover member CG and the display panel PNL. For this reason, in this embodiment, the connecting material C is not formed in the region between the first hole VA and the display area DA above the second surface 20B. Thus, the distance from an inner edge IP of the light-shielding layer SH to the connecting material C can be increased in plan view. In this manner, it is possible to make it hard for the user to be able to visually recognize the connecting material C. Note that in the case of a comparative example where the connecting material C is formed in the region between the first hole VA and the display area DA, the distance from the inner edge IP of the light-shielding layer SH to the connecting material C is shorter as compared to the case of this embodiment.

Alternatively, if the cover member CG and the display panel PNL can be aligned with high precision, the distance from the inner edge IP of the light-shielding layer SH to the contact hole V can be shortened in plan view as compared to the case of the above-described comparative example.

Next, the second conductive layer L2 (the terminals RT) of this embodiment will be described. FIG. 6 is a plan view of the vicinity of the terminals RT (RT1, RT2, RT3, RT4, . . . ) according to this embodiment.

As shown in FIG. 6, the terminals RT each comprise a first projection R1, a second projection R2, a third projection R3, a fourth projection R4, a fifth projection R5, and a wall portion WL.

The first projection R1 is formed into a slender annular shape (projection shape) elongated in a circumferential direction of the first hole VA. The first projection R1 surrounds the first hole VA while maintaining a gap from the opening of the first hole VA in the second surface 20B of the second basement 20. In the example shown in FIG. 6, the gap between the first hole VA and the inner circumferential surface R11 of the first projection R1 is constant. The second surface 20B is exposed between the first hole VA and the first projection R1.

The second projection R2 extends toward the first hole VA from the inner circumferential surface R11 of the first projection R1. The second projection R2 is located to extend between the first hole VA and the first projection R1. With this structure, the connection reliability between the connecting material C provided in the first hole VA and the first projection R1 is improved. Each terminal RT may comprise a single second projection R2, or a plurality of second projections R2 as in this embodiment. When the terminal RT comprises a plurality of second projections R2, the connection reliability can be further improved. The second projections R2 are arranged while maintaining a gap between each other in the circumferential direction of the first hole VA. In the example shown in FIG. 6, eight of the second projections R2 are arranged at equal intervals.

The third projection R3 is formed into a slender annular shape (projection shape) elongated in the circumferential direction of the first hole VA. The third projection R3 has a diameter greater than that of the first projection R1 similarly formed into an annular shape, and is arranged to surround the first projection R1. In other words, the third projection R3 is located outside the first projection R1 as viewed from the first hole VA side.

In the example shown in FIG. 6, the first projection R1 and the third projection R3 are arranged to be coaxial and the gap between an outer circumferential surface R13 of the first projection R1 and an inner circumferential surface R31 of the third projection R3 is constant. In other words, a slit RSL1 which exposes the second surface 20B is formed between the first projection R1 and the third projection R3. The width of the slit RSL1 is not necessarily constant over the entire circumference, but may vary partially.

The fourth projection R4 is disposed to cross the slit RSL1 and couple the first projection R1 and the third projection R3 to each other. The terminals RT each comprise a plurality of fourth projections R4. Or the terminals RT may each comprise a single fourth projection R4. When the terminals RT each comprise a plurality of fourth projections R4, the connection reliability between the first projection R1 and the third projection R3 can be improved. The fourth projections R4 are arranged while maintaining gaps therebetween in the circumferential direction of the first projection R1. In the example shown in FIG. 6, eight of the fourth projections R4 are arranged at equal intervals.

Further, in this embodiment, the second projection R2 and the fourth projection R4 are arranged on the same straight line. But the second projection R2 and the fourth projection R4 may be spaced from each other in the circumferential direction of the first hole VA unlike this embodiment.

The first projection R1 is electrically connected to the body portion RS of the respective detection electrode Rx via the second projection R2, the third projection R3 and the connector CN of the detection electrode Rx. The body portion RS is an example of the electrode portion.

A fifth projection R5a, a fifth projection R5b and the wall portion WL are located further outside the third projection R3 as viewed from the first hole VA side, to surround the third projection R3. In other words, the fifth projection R5a, the fifth projection R5b and the wall portion WL are arranged further outside the third projection R3 in the diametrical direction of the first hole VA. In the example shown in FIG. 6, the fifth projection R5a and the fifth projection R5b are formed into a slender projection as in the case of the first projection R1 and the third projection R3. The wall portion WL is formed into a plate shape. Note that the shapes of the fifth projection R5a, the fifth projection R5b and the wall portion WL are not limited to these, but can be changed into various ways.

Moreover, the fifth projection R5a, the fifth projection R5b and the wall portion WL do not need to be electrically connected with the first projection R1. In the example shown in FIG. 6, the fifth projection R5a, the fifth projection R5b and the wall portion WL are isolated electrically and physically from the other parts of the second conductive layer L2.

The fifth projection R5a and the fifth projection R5b each comprise an inner surface R51 which opposes the first hole VA and the wall portion WL comprises an inner surface WLS which opposes the first hole VA. In the example shown in FIG. 6, the gap between the first hole VA and the inner surface R51 and the gap between the first hole VA and the inner surface WLS are constant. Note that each gap does not need to be constant over the entire circumference, but may vary partially.

The terminals RT according to this embodiment are described above with reference to FIG. 6. But the pattern of the terminals RT is not limited to the example shown in FIG. 6, but may be modified in various ways.

As an example of the terminals RT, the first projection R1 and the third projection R3 each may not be continuously annular over the entire circumference, but may be partially interrupted.

Alternatively, as shown in FIG. 7, in another example of the terminals RT, the terminals RT may further comprise a sixth projection R6. The sixth projection R6 couples the third projection R3 and the fifth projection R5 to each other. The terminals RT each comprise a plurality of sixth projections R6. The terminals RT may each comprise a single sixth projection R6. The sixth projections R6 are arranged while maintaining gaps therebetween in the circumferential direction of the third projection R3.

Moreover, in this modification, the sixth projection R6 is arranged on the same straight line on which the second projection R2 and the fourth projection R4 are arranged. But, the sixth projection R6 does not need to be located on the same straight line on which either one of the second projection R2 and the fourth projection R4 is located, unlike this modification.

In addition, the widths of the first projection R1 to the sixth projection R6 are about several micrometers to several tens of micrometers as in the case of the metal thin wires which form the body portion RS. The widths of the first projection R1 to the sixth projection R6 may be the same as or different from each other.

Next, the non-display area NDA will be described.

Figure 8:
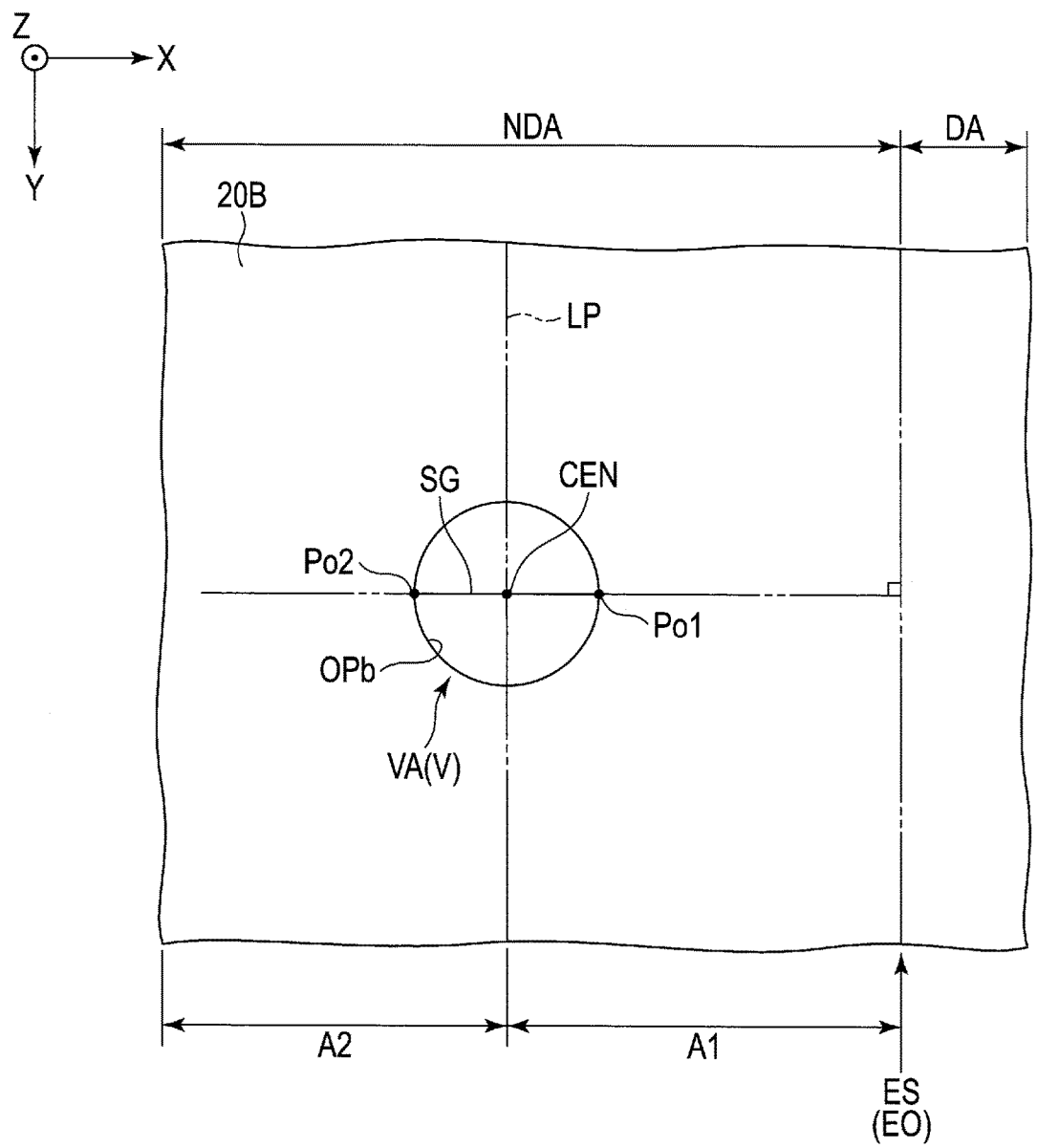
FIG. 8 is a plan view showing a first hole and the second surface, shown in FIG. 5.

As shown in FIG. 8, in the second surface 20B, the non-display area NDA comprises a first area A1 and a second area A2. A virtual line LP passes through a center CEN of the first hole VA at the second surface 20B. And the virtual line LP extends along a side edge ES, that is one of outer edges EO, opposing the first hole VA. The first area A1 is located between the side edge ES (the outer edge EO) and the virtual line LP. The second area A2 is located on the outer side with respect to the virtual line LP. In this embodiment, the virtual line LP is parallel to the second direction Y. Further, the center CEN of first hole VA corresponds to a center of a line segment SG which connects a first intersection Po1 to a second intersection Po2. Then, the first intersection Po1 is located closest to the display area DA on the opening edge OPb and intersects a straight line perpendicular to the side edge ES. And the second intersection Po2 is located most distant from the display area DA on the opening edges OPb and intersects the straight line. The opening edge OPb of the first hole VA at the second surface 20B is formed the first region A1 and the second region A2 across the virtual line LP.

Figure 9:
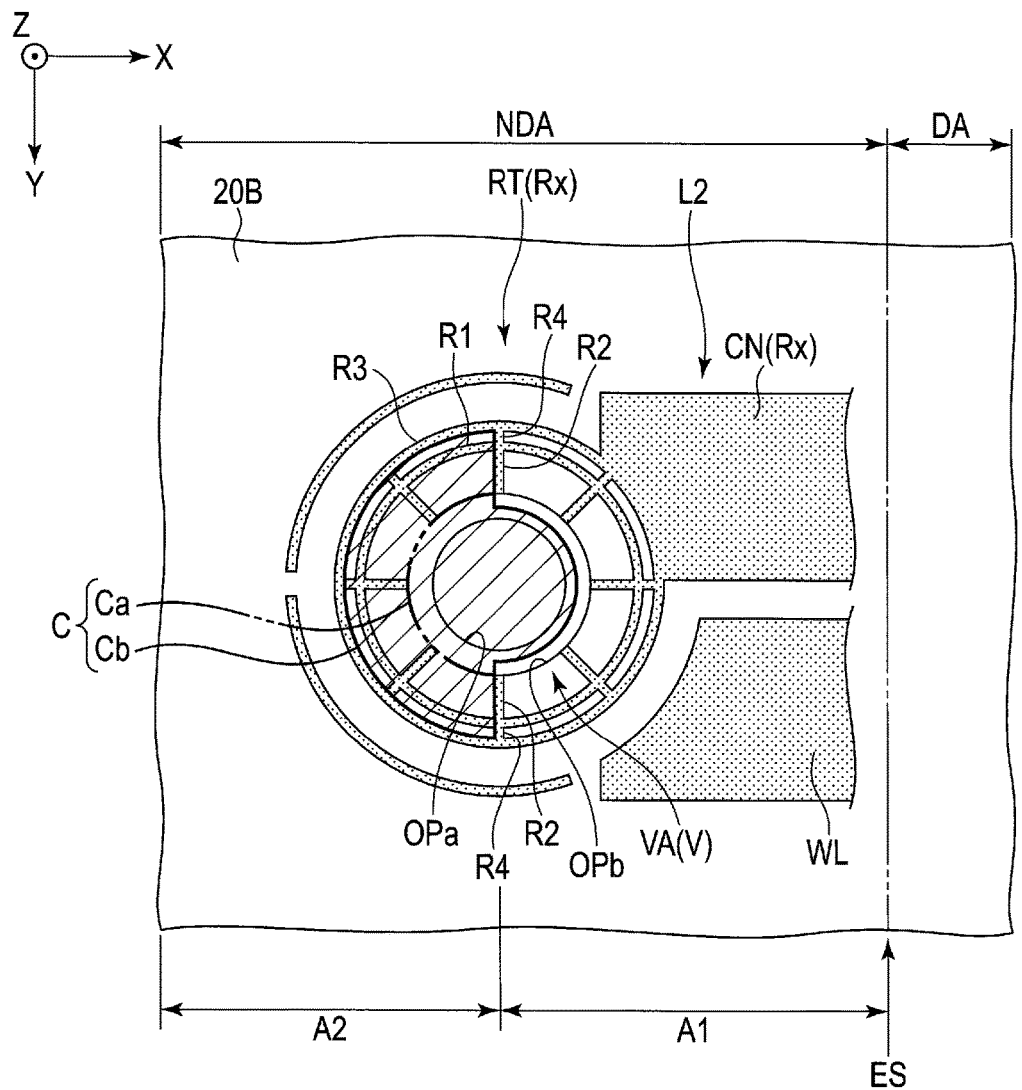
FIG. 9 is a plan view showing a second conductive layer, a second surface and a connecting material according to the first embodiment.

Next, the connecting material C and the second conductive layer L2 (terminals RT) of this embodiment will be described. FIG. 9 is a plan view of the connecting material C and the terminals RT (RT1, RT2, RT3, RT4, . . . ) according to this embodiment as viewed from a cover member CG side. In the figure, the connecting material C is indicated with hatch lines.

As shown in FIG. 9, the connecting material C is provided in the second area A2 above the second surface 20B, but not in the first area A1. The connecting material C is in contact with at least the first projection R1 in the second area A2. Here, the connecting material C is in contact with the first projection R1, the second projection R2, the third projection R3 and the fourth projection R4.

The connecting material C is formed by integrating the first portion Ca and the second portion Cb with each other as one. The connecting material C covers at least partially a portion of the opening edge OPb, which belongs to the second area A2, but does not cover the portion which belongs to the first area A1. The first portion Ca is located inside the contact hole V, but not located above the second surface 20B (which is, in other words, an upper opening edge). The second portion Cb has a semicircular arch shape in plan view. The shape of the semicircular arch is equivalent to one half of the divided annular ring. The second portion Cb overrides on the second surface 20B in the second area A2. The second portion Cb is laid on the first projection R1, the second projections R2 and the fourth projections R4.

In the example shown in FIG. 9, the third projection R3, the two second projections R2 extending in the second direction Y and the two fourth projections R4 extending in the second direction Y hold back the connecting material C. With the structure described above, the pattern of the terminals RT contributes to the suppression of the spreading of the connecting material C towards the display area DA side.

According to the display device DSP of the first embodiment constituted as above, the detection electrodes Rx provided on the second substrate SUB2 are connected to the pads P provided in the first substrate SUB1 with the connecting material C provided in the contact hole V. Thus, it is no longer necessary to mount the circuit board for connecting the detection electrodes Rx and the detector RC to each other, on the second substrate SUB2. In other words, the circuit board 3 mounted in the first substrate SUB1 forms a transmission path for transmitting signals necessary to display images on the display panel PNL and also a transmission path for transferring signals between the detection electrodes Rx and the detector RC.

Therefore, as compared to the configuration example which requires a separate circuit board besides the circuit board 3, the number of circuit boards can be reduced and the cost can be reduced. Moreover, the space for connecting the circuit board to the second substrate SUB2 is no longer necessary. Thus, the width of the non-display area NDA of the display panel PNL, particularly, the width of the edge side thereof where the circuit board 3 is mounted, can be reduced. In this manner, the frame can be narrowed and low cost can be realized.

The connecting material C is formed in the second area A2 above the second surface 20B, but not provided in the first area A1. The connecting material C covers at least partially the portion of the opening edge OPb, which belongs to the second area A2, but does not cover the portion belonging to the first area A1.

With this structure, it is possible to make it hard for the user to visually recognize the connecting material C, and therefore a display device DSP with excellent display quality can be obtained.

Further, the distance from the inner edge IP of the light-shielding layer SH to the contact hole V in plan view can be decreased, and therefore a display device SP with a narrowed frame can be obtained.

The second conductive layer L2 comprises the first projection R1, which can suppress the spreading of the connecting material C to the outside of the first projection R1. The second conductive layer L2 further comprises the third projection R3 to surround the first projection R1. Therefore, even if the connecting material C overrides the first projection R1, the spreading of the connecting material C to the outside of the third projection R3 can be suppressed.

At this time, the overflowing connecting material C is brought into contact with not only the inner circumferential surface R11 and the upper surface R12 of the first projection R1 but also the outer circumferential surface R13 of the first projection R1 and the inner circumferential surface R31 of the third projection R3 as it detour around. Thus, the contact area between the connecting material C and the second conductive layer L2 can be expanded, thereby making it possible to stabilize the resistance between the connecting material C and the second conductive layer L2.

Furthermore, the second conductive layer L2 comprises the second projections R2 closer to the first hole VA than from the first projection R1. In the example shown in FIG. 6, a distal end R2a of the second projection R2 is formed to be flush with the first hole VA. Even if the connecting material C is short for the first projection R1 to be unable to fully secure the contact area with the connecting material C, the second projection R2 still can be in contact with the connecting material C. According to this embodiment, the connection reliability between the connecting material C and the first projection R1 can be secured via the second projection R2.

As described above, a display device DSP with excellent display quality can be obtained. Or a display device DSP with a narrowed frame can be obtained.

Modification 1 of the First Embodiment

Next, the modification 1 of the above-described first embodiment will be described. As shown in FIG. 10, the modification 1 is different from the first embodiment in the shape of the connecting material C. In plan view, the second portion Cb has a quadrant arch shape. The shape of the quadrant arch is equivalent to one quarter of the four equally divided annular ring. The second portion Cb is located inside the contact hole V and overrides on the second surface 20B in the second area A2. The second portion Cb is overlaid on the first projection R1, a single second projection R2 and a single fourth projection R4. The second projection R2 and the fourth projection R4 described here are each located on one edge SI side of the second surface 20B with regard to the contact hole V, and each extend in the first direction X.

In the example shown in FIG. 10, the third projection R3, the single second projection R2 and the single fourth projection R4 extending in the fourth direction d4, the single second projection R2 and the single fourth projection R4 extending in the fifth direction d5 hold back the connecting material C. Here, in the X-Y plane, the fourth direction d4 is different from the first direction X and the second direction Y, and the fifth direction d5 is different from the first direction X, the second direction Y and the fourth direction d4. As can be seen from the above-provided description, in the modification 1 as well, the pattern of the terminals RT contributes to the suppression of spreading of the connecting material C to the display area DA side. This modification 1 as well can achieve an advantageous effect similar to that of the above-described embodiment.

Modification 2 of the First Embodiment

Next, the modification 2 of the above-described first embodiment will be described. As shown in FIG. 11, the modification 2 is different from the first embodiment and the modification 1 in the shape of the connecting material C. The second portion Cb extends from the first portion Ca to a fifth projection R5 side in a direction opposite to the first direction X. In plan view, the second portion Cb has, for example, an elliptical shape. The second portion Cb is located inside the contact hole V and overrides on the second surface 20B in the second area A2. The second portion Cb is overlaid on the first projection R1, a single second projection R2, the third projection R3 and a single fourth projection R4. The second projection R2 and the fourth projection R4 described here are each located on one edge SI side with regard to the contact hole V, and each extend in the first direction X.

In the example shown in FIG. 11, even if the second portion Cb of the connecting material C is formed to spread out, the second projection R2 and the fourth projection R4 extending in the fourth direction d4, and the second projection R2 and the fourth projection R4 extending in the fifth direction d5 hold back the second portion Cb. As described above, in the modification 2 as well, the pattern of the terminals RT contributes to the suppression of spreading of the connecting material C to the display area DA side. The modification 2 as well can achieve an advantageous effect similar to that of the above-described embodiment.

Modification 3 of the First Embodiment

Next, the modification 3 of the above-mentioned first embodiment will be described. As shown in FIG. 12, the modification 3 is different from the first embodiment, the modification 1 and the modification 2 in the shape of the connecting material C. The connecting material C is formed by integrating the first portion Ca and three second portions Cb, Cc and Cd with each other as one body. The second portion Cb extends from the first portion Ca to the fifth projection R5 side in a direction opposite to the first direction X. The second portion Cc extends from the first portion Ca to the fifth projection R5 side in a direction opposite to the fourth direction d4. The second portion Cd extends from the first portion Ca to the fifth projection R5 side in the fifth direction d5. In plan view, the second portions Cb, Cc and Cd each have, for example, an elliptical shape. Each of the second portions Cb, Cc and Cd is located inside the contact hole V and overrides on the second surface 20B in the second area A2.

The second portion Cb is overlaid on the first projection R1, the third projection R3, and the single second projection R2 and the single fourth projection R4 which are located on one edge SI side with regard to the contact hole V, and extends in the first direction X.

The second portion Cc is overlaid on the first projection R1, the third projection R3, and the single second projection R2 and the single fourth projection R4 which are located on one edge SI side with regard to the second projection R2 extending in the second direction Y and extends in the fourth direction d4.

The second portion Cd is overlaid on the first projection R1, the third projection R3, and the single second projection R2 and the single fourth projection R4 which are located on one edge SI side with regard to the second projection R2 extending in the second direction Y and extends in the fifth direction d5.

In the example shown in FIG. 12, even if the second portions Cc and Cd of the connecting material C are formed to spread out, the second projection R2 and the fourth projection R4 extending in the second direction Y can hold back the second portions Cc and Cd. As described above, in the modification 3 as well, the pattern of the terminals RT contributes to the suppression of spreading of the connecting material C to the display area DA side. The modification 3 as well can achieve an advantageous effect similar to that of the above-described embodiment.

Modification 4 of the First Embodiment

Next, the modification 4 of the above-described first embodiment will be described. As shown in FIG. 13, the modification 4 is different from the first embodiment, etc., in the positions of the contact hole V, the terminals RT and the connecting material C. The contact hole V, the terminals RT and the connecting material C are located closer to one edge SI of the second surface 20B as compared to the cases of the first embodiment, etc., described above.

In FIG. 13, an imaginary circular outline is assigned as a first virtual line PH1 and another imaginary circular outline surrounding the first virtual line PH1 is assigned as a second virtual line PH2. Further, the first projection R1 extends along the first virtual line PH1 and the third projection R3 extends along the second virtual line PH2. Then, in the modification 4, the first virtual line PH1 and second virtual line PH2 each extend over the edge SI. Therefore, the first projection R1 and the third projection R3 discontinue near the edge SI.

As shown in FIG. 14, the connecting material C is formed by integrating the first portion Ca and two second portions Cc and Cd with each other as one body. The second portion Cc extends from the first portion Ca to a third projection R3 side in a direction opposite to the fourth direction d4. The second portion Cd extends from the first portion Ca to the third projection R3 side in the fifth direction d5. In plan view, the second portions Cc and Cd each have, for example, an elliptical shape. The second portions Cc and Cd are each located inside the contact hole V and overrides on the second surface 20B in the second area A2.

The second portion Cc is overlaid on the first projection R1, the third projection R3, and the single second projection R2 and the single fourth projection R4 which are located on one edge SI side with regard to the second projection R2 extending in the second direction Y and extends in the fourth direction d4.

The second portion Cd is overlaid on the first projection R1, the third projection R3, and the single second projection R2 and the single fourth projection R4 which are located on one edge SI side with regard to the second projection R2 extending in the second direction Y and extends in the fifth direction d5.

In the example shown in FIG. 14, even if the second portions Cc and Cd of the connecting material C are formed to spread out, the second projection R2 and the fourth projection R4 extending in the second direction Y can hold back the second portions Cc and Cd. As described above, in the modification 4 as well, the pattern of the terminals RT contributes to the suppression of spreading of the connecting material C to the display area DA side. The modification 4 as well can achieve an advantageous effect similar to that of the above-described embodiment.

Further, in the modification 4, the contact hole V, the terminals RT and the connecting material C can be provided nearer to the edge SI as compared to the first embodiment, etc., described above. With such a configuration, the modification 4 can further contribute to the narrowing of the frame, that is to say, the narrowing of the non-display area NDA.

Modification 5 of the First Embodiment

Next, the modification 5 of the above-described first embodiment will be described.

Figure 15:
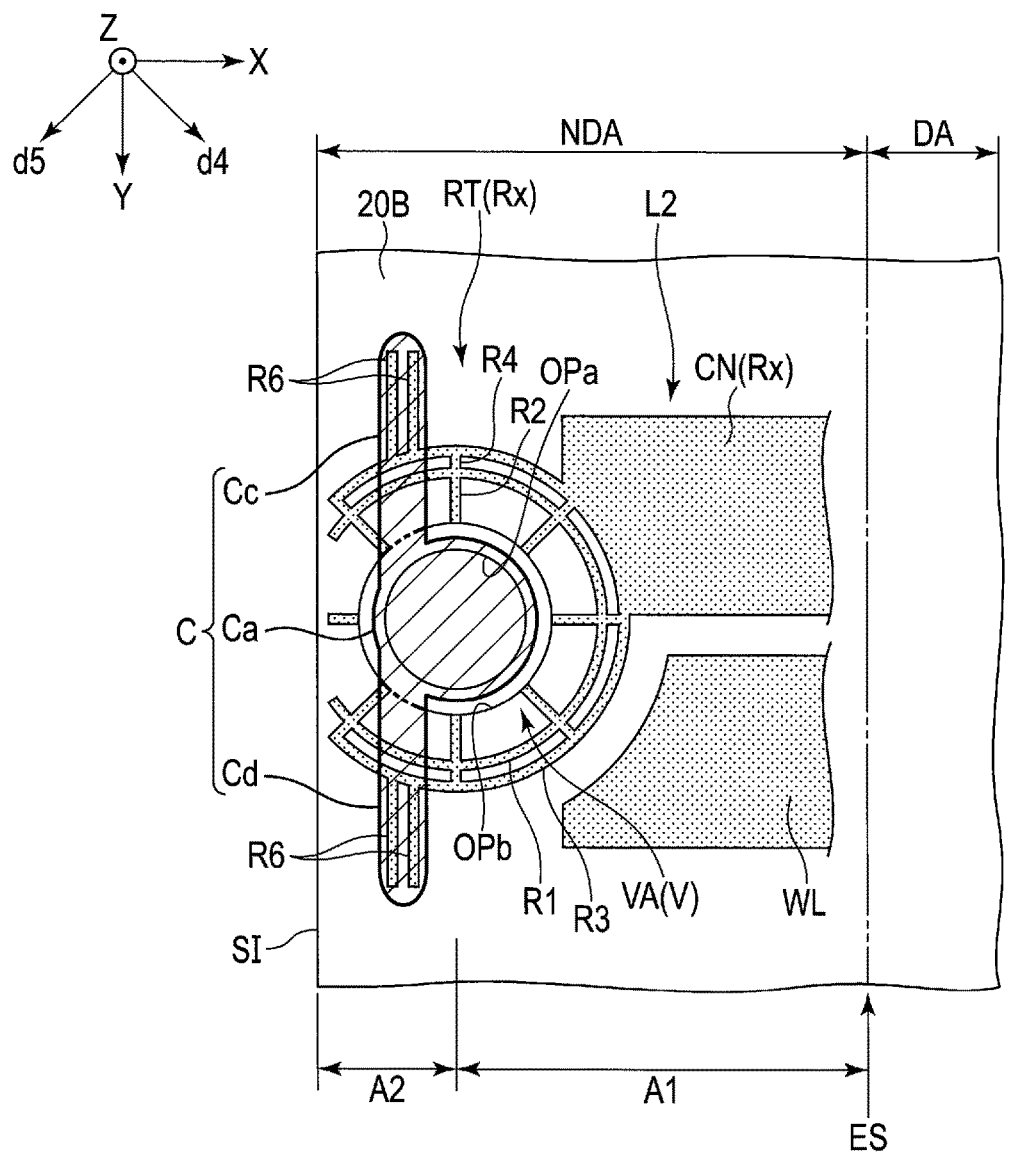
FIG. 15 is a plan view showing a second conductive layer, a second surface and a connecting material according to a modification 5 of the first embodiment.

As shown in FIG. 15, the first hole VA is located between the display area DA and one edge SI of the second surface 20B. In the modification 5 as well, the contact hole V, the terminals RT and the connecting material C are located near the edge SI of the second surface 20B. But, the terminals RT of the modification 5 each further comprise sixth projections R6 as compared to the terminals RT of the modification 4. The sixth projection R6 is located on an outer side of the first projection R1, electrically connected to the first projection R1 and extends along the edge SI. In the example shown in FIG. 14, two sixth projections R6 extend from the third projection R3 in a direction opposite to the second direction Y in a region on an one edge SI side with regard to the second projection R2 and also above the contact hole V. In a region on the one edge SI side with respect to the second projection R2 and also below the contact hole V, two other sixth projections R6 extend from the third projection R3 in the second direction Y.

The connecting material C is formed by integrating the first portion Ca and two second portions Cc and Cd with each other as one body. The second portion Cc extends from the first portion Ca toward the upper sixth projections R6 in a direction opposite to the second direction Y The second portion Cd extends from the first portion Ca toward a sixth projection R6 side in the second direction Y. The second portions Cc and Cd are each located inside the contact hole V and overrides on the second surface 20B in the second area A2.

The connecting material C is in contact with at least the first projection R1 and the sixth projections R6. The second portion Cc is overlaid on the first projection R1, the second projection R2 extending in the fourth direction d4, the third projection R3, and the two upper sixth projections R6. The second portion Cd is overlaid on the first projection R1, the second projection R2 extending in the fifth direction d5, the third projection R3 and the two lower sixth projections R6.

In the example shown in FIG. 15, even if the second portions Cc and Cd of the connecting material C are formed to spread out, the second projection R2 and the fourth projection R4 extending in the second direction Y can hold back the second portions Cc and Cd. As described above, in the modification 5 as well, the pattern of the terminals RT contributes to the suppression of spreading of the connecting material C to the display area DA side. The modification 5 as well can achieve an advantageous effect similar to that of the above-described embodiment.

Further, in the modification 5, the connecting material C is in contact with the sixth projections R6. With this configuration, the modification 5 can stabilize the resistance between the connecting material C and the second conductive layer L2 as compared to the modification 4.

Modification 6 of the First Embodiment

Figure 16:
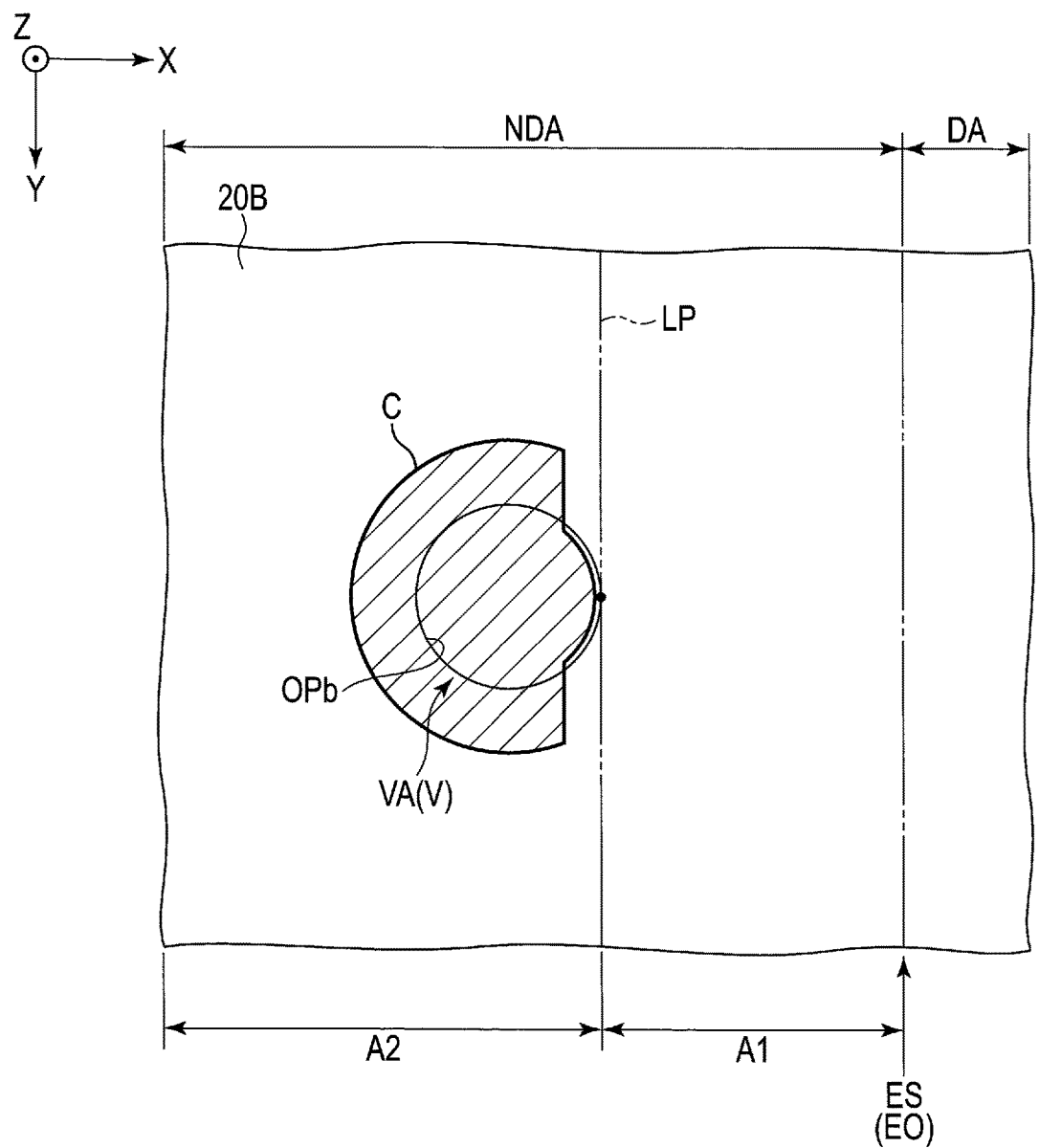
FIG. 16 is a plan view showing a first hole, a connecting material and a second surface according to a modification 6 of the first embodiment.

Next, the modification 6 of the above-described first embodiment will be described. As shown in FIG. 16, the position of a virtual line LP corresponding to the boundary between the first area A1 and the second area A2 may be different from that of the example shown in FIG. 8 or the like. In the modification 6, the virtual line LP passes the section of the opening edge OPb of the first hole VA, which is most close to the display area DA and extends along the side edge ES, which opposes the first hole VA. The connecting material C covers an opening edge OPb of the first hole VA and is provided above the second area A2, but not above the first area A1.

The modification 6 can make it hard for the user to visually recognize the connecting material C, thus achieving an advantageous effect similar to that of the above-described embodiment.

Second Embodiment

Next, the second embodiment will be described. The display device DSP of the second embodiment is different from that of the first embodiment in the structure of the light-shielding layer SH and the method of preparing the light-shielding layer SH.

Figure 17:
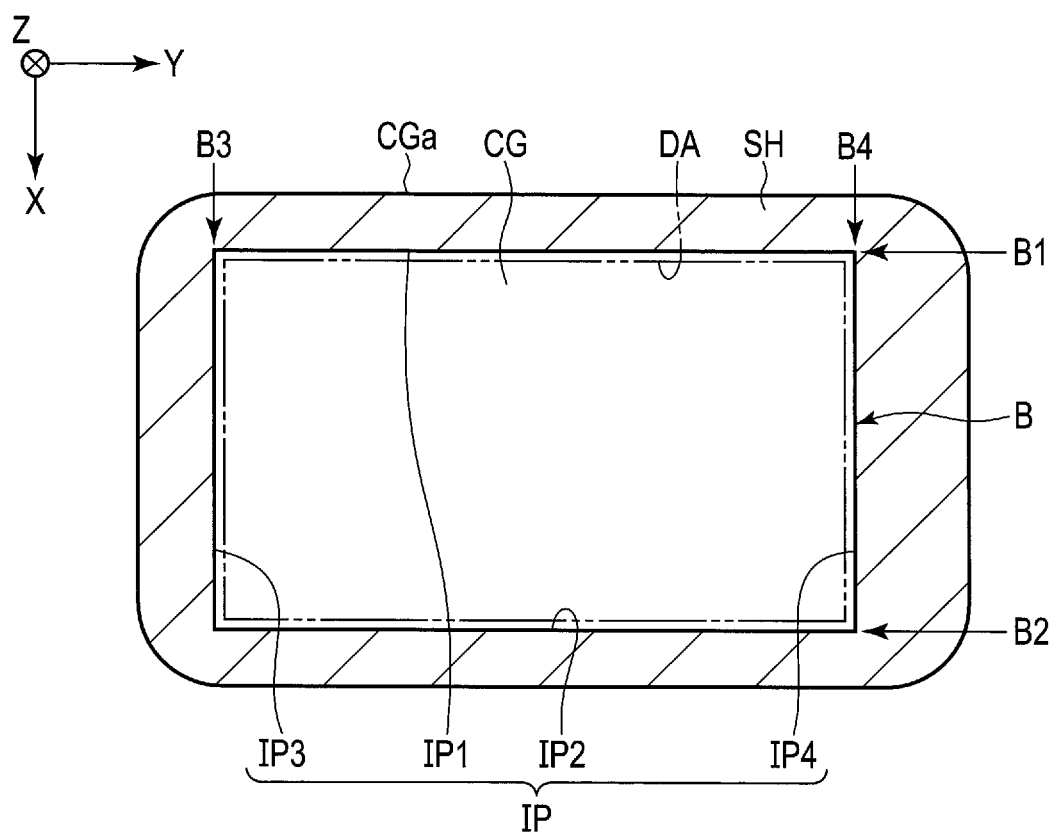
FIG. 17 is a plan view showing a cover member and a light-shielding layer of a display device of a second embodiment.

As shown in FIG. 17, the light-shielding layer SH is located on an outer side of the display area DA in a region which opposes the cover member CG. In the figure, the light-shielding layer SH is hatched. An internal edge IP of the light-shielding layer SH is located on the outer side of the display area DA and has such a shape formed along the outline of the display area DA. In this embodiment, the display area DA comprises a pair of straight sides along the second direction Y and a pair of straight sides along the first direction X. With this structure, it is preferable that the inner edge IP have straight lines IP1 and IP2 along the second direction Y and straight lines IP3 and IP4 along the first direction X.

In other words, the inner edge IP should preferably be located on a frame-like reference line B, and should not preferably be shifted from the reference line B to the display area DA side, and to the outer periphery CGa side of the cover member CG. Here, the reference line B is an imaginary line which represents the ideal position of the inner edge IP. The reference line B comprises a first reference line B1 which represents the ideal position of the line IP1, a second reference line B2 which represents the ideal position of the line IP2, a third reference line B3 which represents the ideal position of the line IP3 and a fourth reference line B4 which represents the ideal position of the line IP4.

The reference line B is defined as "0 (boundary)", and the display area DA side with respect to the reference line B is defined as "+ (+ area)", whereas the outer periphery CGa side to the reference line B is defined as "− (− area)". Based on these definitions, the inner edge IP should preferably be located within a range from −20 to +20 µm with respect to the reference line B. That is, on the inner edge IP of the light-shielding layer, actually, the formation of projections and recesses can be observed in a microscopic viewpoint, but the width of the projections and recesses should preferably be within a range of 40 µm. In this manner, the straight lines IP1, IP2, IP3 and IP4 can be obtained. Note that the inner edge IP should more preferably be located within a range from −10 µm to +10 µm with respect to the reference line B.

Figure 18:
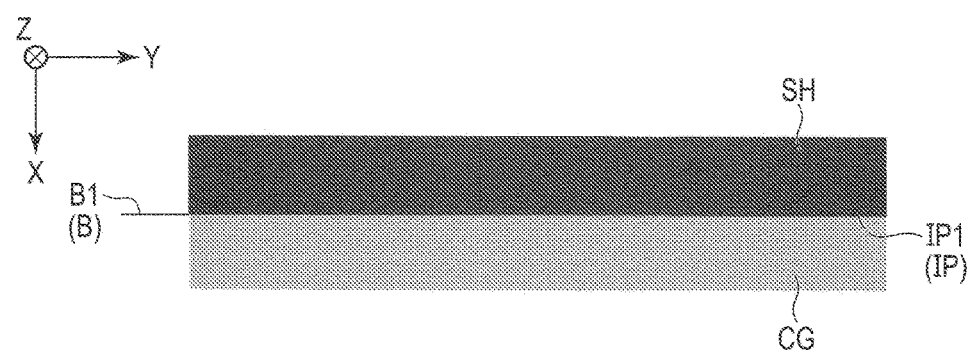
FIG. 18 is a diagram obtained by photographing a scanning electron microscope showing parts of the cover member and the light-shielding layer shown in FIG. 17, which is an enlarged plan view showing a part of a line of an inner edge of the light-shielding layer, which extends in a second direction and a vicinity thereof.

Here, let us focus on the line IP1 as a representative example in the inner edge IP of the light-shielding layer SH. FIG. 18 is a diagram obtained by photographing a scanning electron microscope showing parts of the cover member CG and the light-shielding layer SH shown in FIG. 17, which is an enlarged plan view showing a part of the line IP1 of the inner edge IP of the light-shielding layer SH, which extends in the second direction Y, and a vicinity thereof.

As shown in FIG. 18, the line 1P1 extends straight in the second direction Y. The position of the line IP1 with respect to the first reference line B1 was measured, and the result thus obtained indicated that the line IP1 was located within a range from −10 µm to +10 µm with respect to the first reference line B1.

As can be seen from the results shown in FIGS. 18 and 17, in the direction normal to the first reference line B1 (the direction parallel to the first direction X), the line IP1 does not shift more than 10 µm from the first reference line B1 to the display area DA side, and to the outer periphery CGa side.

Figure 19:
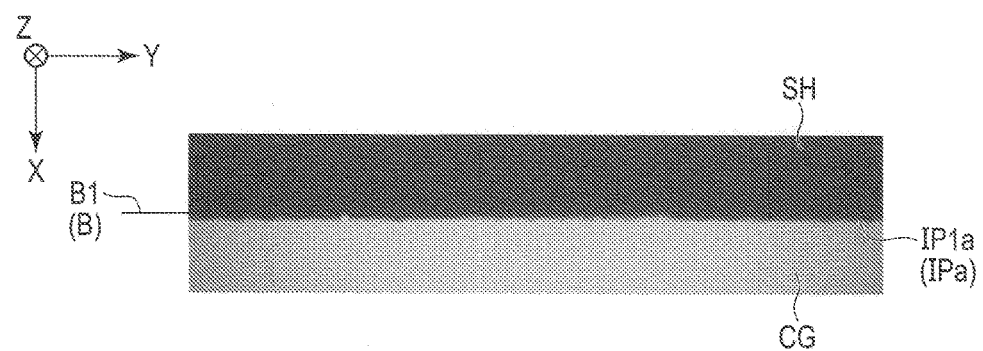
FIG. 19 is a diagram obtained by photographing a scanning electron microscope showing the same area as FIG. 18 in the middle of the manufacturing process of the display device of the second embodiment, and illustrates the state where the light-shielding layer was formed on cover member by screen printing.

Next, a method of preparing the light-shielding layer SH will be described. FIG. 19 is a diagram obtained by photographing a scanning electron microscope showing the same area as that of FIG. 18 during the manufacturing process of the display device DSP of the second embodiment, which shows a state where the light-shielding layer SH is formed on the cover member CG by screen printing.

FIG. 19 shows the formation of the light-shielding layer SH. First, a light-shielding layer SH was formed on the cover member CG by screen printing. As can be seen in the figure, a line IP1a of the (resultant) light-shielding layer SH during the preparation did not extend straight in the second direction Y Here, the position of the line IP1a to the first reference line B1 was measured, and the result indicated that the line IP1a shifted from the first reference line B1 approximately 100 µm to the display area DA side. More specifically, the line IP1a extends in the second direction Y with meandering.

Then, after the screen printing, the region of the inner circumference of the (resultant) light-shielding layer SH was irradiated with laser beam by laser scanning in alignment with the reference line B. Thus, the meandering inner edge IP of the (resultant) light-shielding layer SH including the meandering line IP1a and the like was removed, thereby completing the light-shielding layer SH with the inner edge IP which was less deviated from the reference line B. As described above, the light-shielding layer SH can be formed by the screen printing and the so-called laser trimming which follows the screen printing.

The display device DSP of the second embodiment described above is configured to be similar to that of the first embodiment except for the shape of the light-shielding layer SH. Therefore, the second embodiment can achieve an advantageous effect similar to that of the first embodiment described above.

Further, in the second embodiment, the position of inner edge IP of the light-shielding layer SH can be stabilized.

The light-shielding layer SH can steadily hide the connecting material C. Thus, it is possible to make it hard for the user to visually recognize the connecting material C, and therefore a display device DSP with excellent display quality can be obtained.

Figure 20:
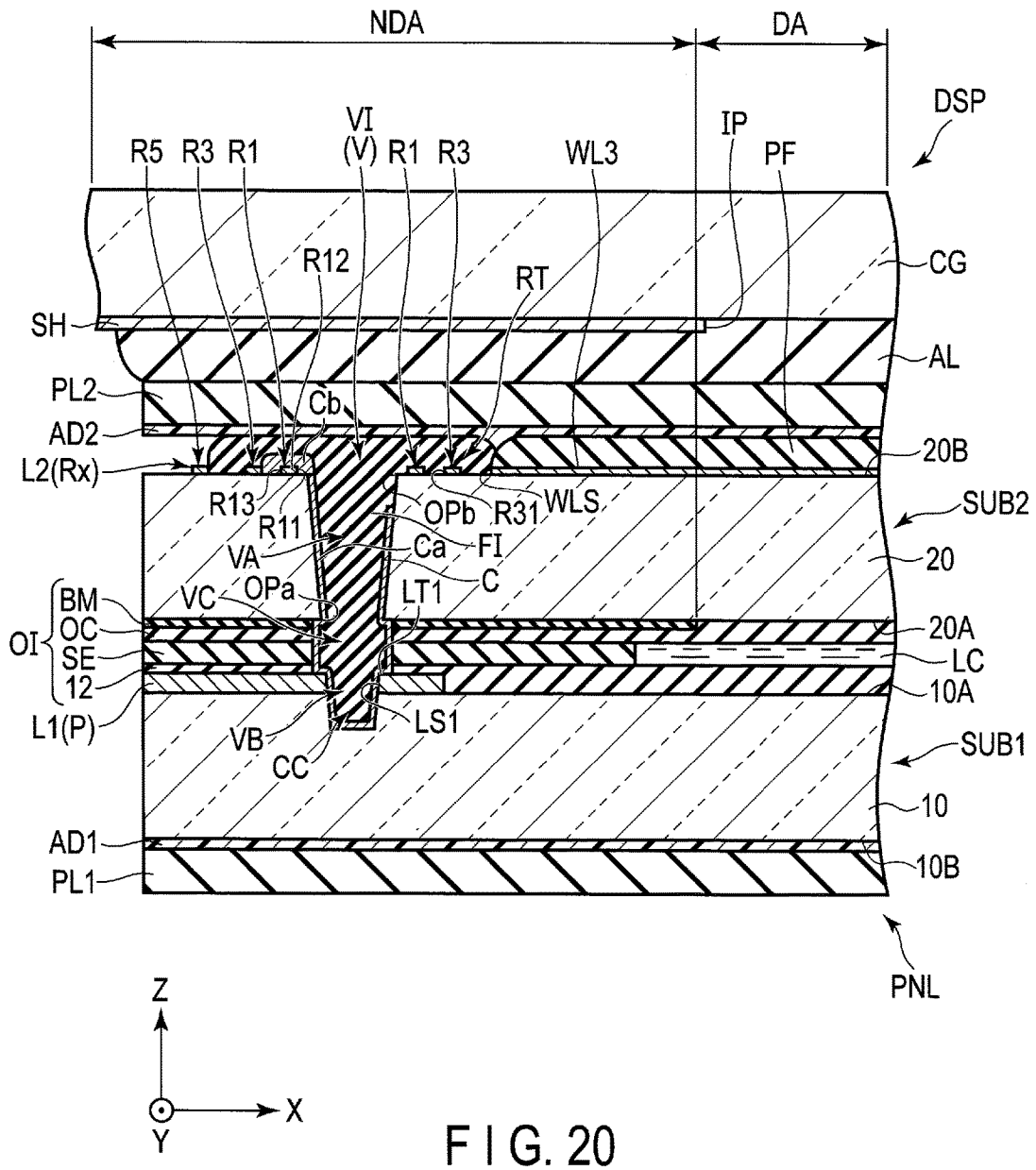
FIG. 20 is a cross section of the display device according to a modification of the embodiments, and shows a light-shielding layer of the modification.

Alternatively, the inner edge IP of the light-shielding layer SH can be brought close to the display area DA side. In other words, as shown in FIG. 20, the inner edge IP of the light-shielding layer SH can be brought close to a boundary between the display area DA and the non-display area NDA as compared with the inner edge IP shown in FIG. 5.

Or, in plan view, the distance from the inner edge IP of the light-shielding layer SH to the contact hole V can be stabilized, thereby making it possible to obtain a display device SP with a narrowed frame with no or narrower margin.

Or, what is observed by the user is not a meandering inner edge IP but the inner edge IP which has less deviation from the reference line B, thereby making it possible to obtain a display device DSP with excellent display quality.

As described above, according to the present embodiments, a display device DSP with excellent display quality or that with a narrowed frame can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising: a display panel including a display area and a non-display area provided along an outer edge of the display area,
the display panel comprising:
a first substrate including a first basement and a first conductive layer;
a second substrate including a second basement comprising a first surface opposing and located to be spaced from the first conductive layer, a second surface on an opposite side to the first surface, a first hole located in the non-display area and penetrating between the first surface and the second surface, and a second conductive layer provided on the second surface; and
a connecting material which electrically connects the first conductive layer and the second conductive layer to each other via the first hole,
wherein
the non-display area comprises
a first region between the outer edge and a virtual line which passes through a center of the first hole at the second surface and extends along the outer edge, and
a second region located on the outer side with respect to the virtual line, and
an opening edge of the first hole at the second surface is formed the first region and the second region across the virtual line,
the connecting material covers at least partially a portion of the opening edge belonging to the second region without covering a portion of the opening edge belonging to the first region.

2. The display device of claim 1, wherein
the second conductive layer comprises a first projection surrounding the first hole and a second projection extending from the first projection toward the first hole, and
the connecting material is in contact with at least the first projection in the second region.

3. The display device of claim 2, wherein
the second conductive layer further comprises a third projection located on an outer side of the first projection with respect to the first hole and surrounding the first projection, and a fourth projection coupling the first projection and the third projection to each other.

4. The display device of claim 3, wherein
the second conductive layer further comprises a fifth projection located on an outer side of the third projection with respect to the first hole and surrounding the third projection, and a sixth projection coupling the third projection and the fifth projection to each other.

5. The display device of claim 2, wherein
the second conductive layer further comprises a third projection located on an outer side of the first projection with regard to the first hole and surrounding the first projection, and a plurality of fourth projections each coupling the first projection and the third projection to each other,
the fourth projections are arranged with a gap between each adjacent pair thereof in a circumferential direction of the first projection.

6. The display device of claim 5, wherein
the second conductive layer further comprises a fifth projection located on an outer side of the third projection with respect to the first hole and surrounding the third projection, and a sixth projection coupling the third projection and the fifth projection to each other.

7. The display device of claim 2, wherein
the first hole is located between the display area and one side edge of the second surface,
the second conductive layer further comprises a sixth projection which is located on the second region and an outer side of the first projection, is electrically connected to the first projection, and extends along the side edge of the second surface, and
the connecting material is in contact with at least the first projection and the sixth projection.

8. The display device of claim 1, wherein
the second conductive layer comprises a first projection surrounding the first hole and a plurality of second projections each extending from the first projection toward the first hole,
the second projections are arranged with a gap between each adjacent pair thereof in a circumferential direction of the first hole, and
the connecting material is in contact with at least the first projection.

9. The display device of claim 8, wherein
the second conductive layer further comprises a third projection located on an outer side of the first projection with respect to the first hole and surrounding the first projection, and a fourth projection coupling the first projection and the third projection to each other.

10. The display device of claim 9, wherein the second conductive layer further comprises a fifth projection located on an outer side of the third projection with respect to the first hole and surrounding the third projection, and a sixth projection coupling the third projection and the fifth projection to each other.

11. The display device of claim 8, wherein the second conductive layer further comprises a third projection located on an outer side of the first projection with respect to the first hole and surrounding the first projection, and a plurality of fourth projections each coupling the first projection and the third projection to each other, and the fourth projections are arranged with a gap between each adjacent pair thereof in a circumferential direction of the first projection.

12. The display device of claim 11, wherein the second conductive layer further comprises a fifth projection located on an outer side of the third projection with respect to the first hole and surrounding the third projection, and a sixth projection coupling the third projection and the fifth projection to each other.

13. The display device of claim 1, wherein the connecting material comprises a first portion covering a circumferential surface of the first hole and a second portion covering the second region of the second surface.

14. The display device of claim 1, wherein the display panel further comprises a filling material which fills a hollow section of the first hole.

15. The display device of claim 1, wherein the display panel further comprises a second hole located in the non-display area and penetrating the first conductive layer to communicate to the first hole, and the connecting material is in contact with an upper surface on the second substrate side of the first conductive layer and a circumferential surface of the first conductive layer in the second hole.

16. A display device comprising: a display panel including a display area and a non-display area provided along an outer edge of the display area, the display panel comprising:
a first substrate including a first basement and a first conductive layer;
a second substrate including a second basement comprising a first surface opposing and located to be spaced from the first conductive layer, a second surface on an opposite side to the first surface, a first hole located in the non-display area and penetrating between the first surface and the second surface, and a second conductive layer provided on the second surface; and
a connecting material which electrically connects the first conductive layer and the second conductive layer to each other via the first hole,
wherein
the non-display area comprises a first region between the outer edge and a virtual line, and a second region located on the outer side with respect to the virtual line,
the virtual line passes through a point of an opening edge of the first hole on a side of the second surface, which is most close to the display area, and extends along the outer edge of the display area, and
the connecting material covers an opening edge of the first hole on the side of the second surface, and is located above the second region of the second surface without being located above the first region of the second surface.

17. A display device comprising: a display panel including a display area and a non-display area provided along an outer edge of the display area; and a light-shielding layer opposing the non-display area of the display panel,
the display panel comprising:
a first substrate including a first basement and a first conductive layer;
a second substrate including a second basement comprising a first surface opposing and located to be spaced from the first conductive layer, a second surface opposing the light-shielding layer and located on an opposite side to the first surface, and a second conductive layer provided on the second surface;
an organic insulating layer located between the first conductive layer and the second basement;
a contact hole which comprises a first hole penetrating the second basement, a second hole penetrating the first conductive layer and opposing the first hole, and a third hole penetrating the organic insulating layer and connected to the first hole and the second hole, and is covered by the light-shielding layer; and
a connecting material covered by the light-shielding layer and electrically connecting the first conductive layer and the second conductive layer via the contact hole,
wherein
the non-display area comprises a first region located on a side of the display area with respect to a virtual line which passes through the first hole and is parallel to a side edge of the outer edge of the display area, which opposes the first hole, and a second region located on an outer side with respect to the virtual line, and
the connecting material covers a portion of an opening edge of the first hole on the side of the second surface, which belongs to the second region, and is located above the second region of the second surface without being located above the first region of the second surface.

* * * * *